United States Patent
Kirimura

(10) Patent No.: US 10,658,293 B2
(45) Date of Patent: *May 19, 2020

(54) SEMICONDUCTOR DEVICE HAVING A MULTILAYER WIRING STRUCTURE

(71) Applicant: SOCIONEXT INC., Yokohama-shi, Kanagawa (JP)

(72) Inventor: Tomoyuki Kirimura, Yokohama (JP)

(73) Assignee: SOCIONEXT INC., Yokohama-shi (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/232,370

(22) Filed: Dec. 26, 2018

(65) Prior Publication Data

US 2019/0131239 A1 May 2, 2019

Related U.S. Application Data

(62) Division of application No. 15/785,762, filed on Oct. 17, 2017, now Pat. No. 10,204,858.

(30) Foreign Application Priority Data

Oct. 21, 2016 (JP) .................. 2016-207363

(51) Int. Cl.
*H01L 23/528* (2006.01)
*H01L 27/118* (2006.01)
(Continued)

(52) U.S. Cl.
CPC .......... *H01L 23/5286* (2013.01); *G06F 30/00* (2020.01); *G06F 30/394* (2020.01); *H01L 23/5226* (2013.01); *H01L 23/58* (2013.01); *H01L 27/0207* (2013.01); *H01L 27/092* (2013.01); *H01L 27/11807* (2013.01); *H01L 29/785* (2013.01); *H01L 21/0217* (2013.01); *H01L 21/02164* (2013.01); *H01L 21/02167* (2013.01); *H01L 21/26513* (2013.01); *H01L 21/31111* (2013.01); *H01L 21/3212* (2013.01);
(Continued)

(58) Field of Classification Search
CPC . H01L 23/5286; H01L 23/5226; H01L 23/58; H01L 23/53238; H01L 23/53266; H01L 23/53295
See application file for complete search history.

(56) References Cited

U.S. PATENT DOCUMENTS

| | | |
|---|---|---|
| 6,774,484 B2 | 8/2004 | Mimino et al. |
| 9,425,141 B2 | 8/2016 | Hsieh et al. |

(Continued)

*Primary Examiner* — Scott B Geyer
(74) *Attorney, Agent, or Firm* — Westerman, Hattori, Daniels & Adrian, LLP

(57) ABSTRACT

A semiconductor device having a plurality of first wirings (X-direction) which include a first power supply line and a second power supply line, a plurality of third wirings (X-direction) which include a third (fourth) power supply line that is located above the first (second) power supply line and is electrically connected to the first (second) power supply line. The semiconductor device also has a plurality of second wirings (Y-direction) that include a first (second) connection wiring located above the first (second) power supply line and below the third (fourth) power supply line that is electrically connected to the first (second) power supply line and to the third (fourth) power supply line.

20 Claims, 16 Drawing Sheets

(51) Int. Cl.
*G06F 30/00* (2020.01)
*G06F 30/394* (2020.01)
*H01L 23/522* (2006.01)
*H01L 23/58* (2006.01)
*H01L 27/02* (2006.01)
*H01L 27/092* (2006.01)
*H01L 29/78* (2006.01)
*H01L 29/775* (2006.01)
*H01L 21/768* (2006.01)
*H01L 21/02* (2006.01)
*H01L 21/265* (2006.01)
*H01L 21/311* (2006.01)
*H01L 21/321* (2006.01)
*H01L 21/8238* (2006.01)
*H01L 23/532* (2006.01)
*H01L 29/167* (2006.01)

(52) U.S. Cl.
CPC .... *H01L 21/7684* (2013.01); *H01L 21/76802* (2013.01); *H01L 21/76816* (2013.01); *H01L 21/76843* (2013.01); *H01L 21/76877* (2013.01); *H01L 21/823814* (2013.01); *H01L 21/823828* (2013.01); *H01L 21/823871* (2013.01); *H01L 21/823878* (2013.01); *H01L 23/53238* (2013.01); *H01L 23/53266* (2013.01); *H01L 23/53295* (2013.01); *H01L 27/0924* (2013.01); *H01L 29/167* (2013.01); *H01L 29/775* (2013.01); *H01L 2027/11875* (2013.01); *H01L 2027/11881* (2013.01); *H01L 2027/11887* (2013.01)

(56) References Cited

U.S. PATENT DOCUMENTS

| | | |
|---|---|---|
| 9,437,588 B1 | 9/2016 | Zeng et al. |
| 9,852,989 B1 | 12/2017 | Lin et al. |
| 10,204,858 B2 * | 2/2019 | Kirimura ............ G06F 17/5077 |
| 2009/0166883 A1 | 7/2009 | Nishimura |
| 2010/0237508 A1 | 9/2010 | Utsumi |
| 2013/0063203 A1 | 3/2013 | Utsumi et al. |
| 2014/0252650 A1 | 9/2014 | Utsumi |
| 2015/0052494 A1 | 2/2015 | Tarabbia et al. |
| 2015/0214154 A1 | 7/2015 | Nakayama |
| 2015/0248517 A1 | 9/2015 | Lu et al. |
| 2015/0286765 A1 | 10/2015 | Wang et al. |
| 2016/0035628 A1 | 2/2016 | Tsujita et al. |
| 2016/0064369 A1 | 3/2016 | Kondo |
| 2016/0211212 A1 | 7/2016 | Chao et al. |
| 2017/0110405 A1 | 4/2017 | Peng et al. |

* cited by examiner

SEMICONDUCTOR DEVICE HAVING A MULTILAYER WIRING STRUCTURE

CROSS-REFERENCE TO RELATED APPLICATION

This application is a divisional of U.S. application Ser. No. 15/785,762 filed Oct. 17, 2017, which is based upon and claims the benefit of priority of the prior Japanese Patent Application No. 2016-207363, filed on Oct. 21, 2016, the entire contents of which are incorporated herein by reference.

FIELD

The embodiments discussed herein are directed to a semiconductor device.

BACKGROUND

In a wiring structure of a semiconductor device, electro migration (EM) is conventionally considered problematic as one defective mode. As a measure to suppress EM, a so-called support wiring is used. The support wiring is a wiring arranged in a second layer, for example, in a manner to be superposed on a power supply wiring of a first layer of a multilayer wiring structure, and electrically connected to a power supply wiring of an M1 layer. Provision of the support wiring reduces current in the power supply wiring, thereby suppressing occurrence of EM.

[Patent Document 1] U.S. Unexamined Patent Application Publication No. 2015/0248517

[Patent Document 2] U.S. Unexamined Patent Application Publication No. 2015/0052494

[Patent Document 3] U.S. Unexamined Patent Application Publication No. 2015/0286765

[Patent Document 4] U.S. Unexamined Patent Application Publication No. 2016/0035628

In recent years, to response to a need for further microfabrication of the semiconductor device, wiring formation using a so-called double patterning technique increases. In pattern formation by the double patterning technique, the wiring extending in one direction is formed in some cases. In this case, the multilayer wiring structure is sometimes formed as wirings extending alternately in X- and Y-directions perpendicular to each other such that, for example, the first layer extends in the X-direction and the second layer extends in the Y-direction.

However, in the case of forming the power supply wiring, for example, in the first layer extending in the X-direction using the double patterning technique as described above, the second layer on the first layer is formed to extend in the Y-direction, so that the support wiring for the power supply wiring cannot be formed in the second layer.

SUMMARY

An aspect of the semiconductor device includes: a semiconductor substrate; a plurality of first wirings formed above the semiconductor substrate and extending in a first direction in a plan view; a plurality of second wirings formed above the first wirings and extending in a second direction different from the first direction in a plan view; and a plurality of third wirings formed above the second wirings and extending in the first direction in a plan view, wherein: the plurality of first wirings include a first power supply line and a second power supply line; the plurality of third wirings include a third power supply line that is located above the first power supply line and electrically connected to the first power supply line, and a fourth power supply line that is located above the second power supply line and electrically connected to the second power supply line; the plurality of second wirings include a first connection wiring that is located above the first power supply line and below the third power supply line and electrically connected to the first power supply line and to the third power supply line and extends in the second direction in a plan view; and the plurality of second wirings include a second connection wiring that is located above the second power supply line and below the fourth power supply line and electrically connected to the second power supply line and to the fourth power supply line and extends in the second direction in a plan view.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Hereinafter, concrete embodiments of a semiconductor device will be explained in detail with reference to accompanying drawings.

First Embodiment

A first embodiment will be explained first. In this embodiment, a CMOS circuit will be exemplified as the semiconductor device.

[Schematic Configuration of the Semiconductor Device]

Figure 1A:
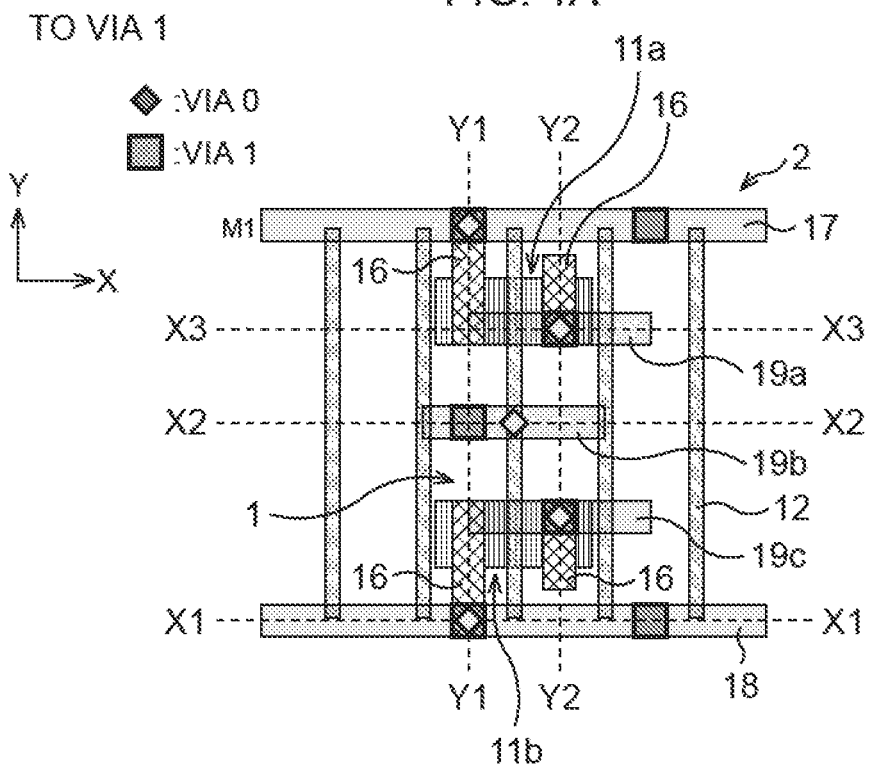
FIG. 1A and FIG. 1B are schematic plan views schematically illustrating a configuration of a CMOS circuit according to a first embodiment.
Figure 1B:
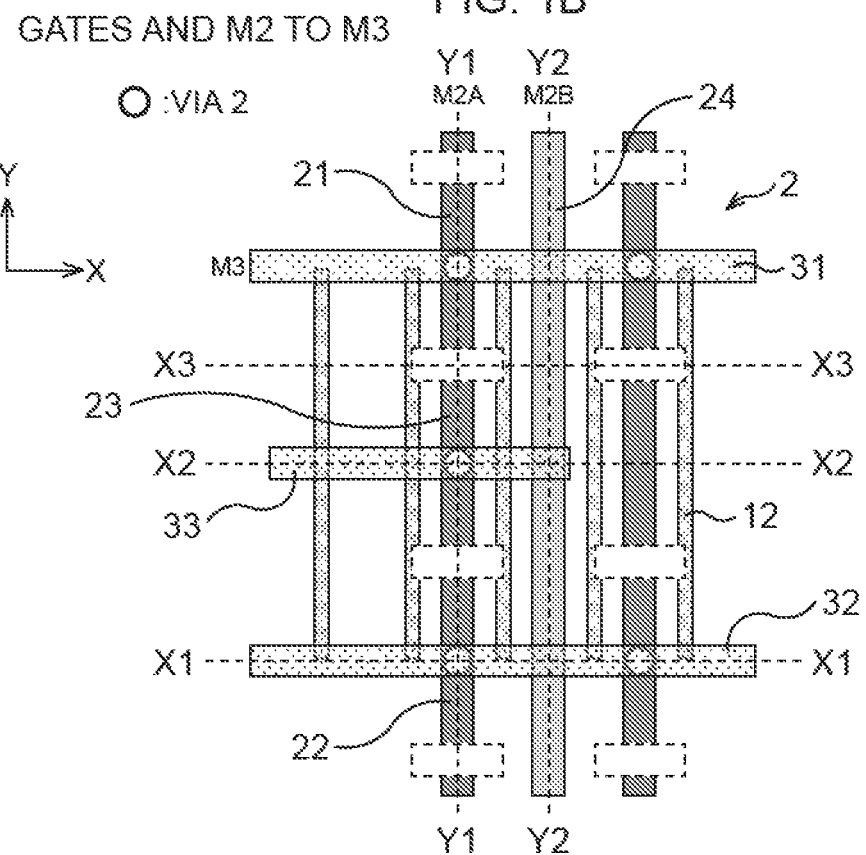
Figure 2A:
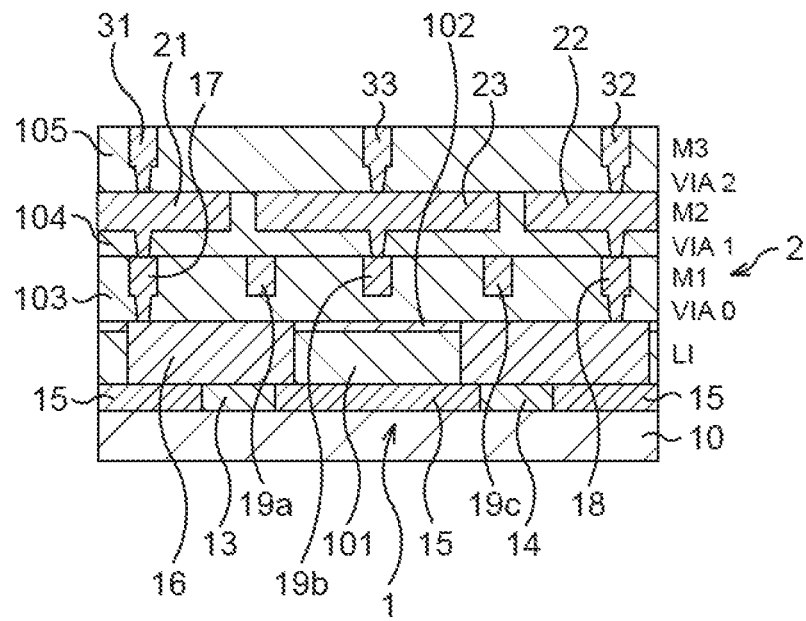
FIG. 2A and FIG. 2B are schematic cross-sectional views taken along a Y-direction in FIG. 1A and FIG. 1B.
Figure 2B:
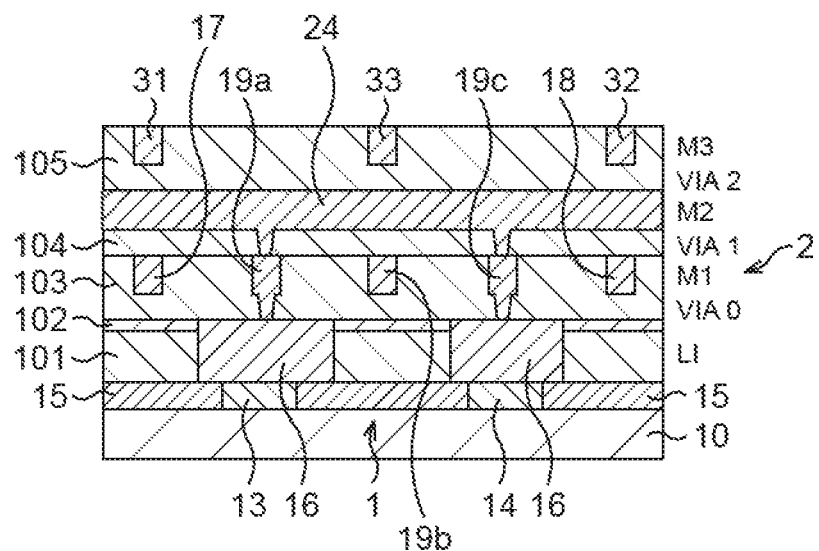
Figure 3A:
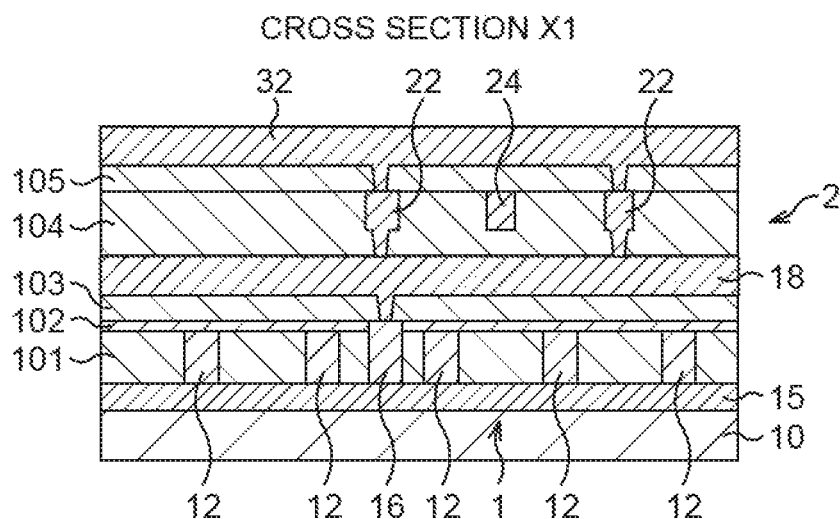
FIG. 3A to FIG. 3C are schematic cross-sectional views taken along an X-direction in FIG. 1A and FIG. 1B.
Figure 3B:
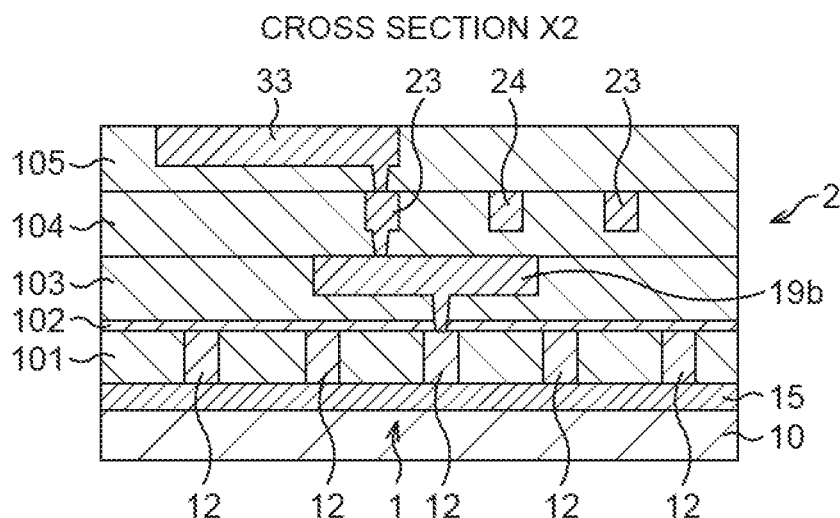
Figure 3C:
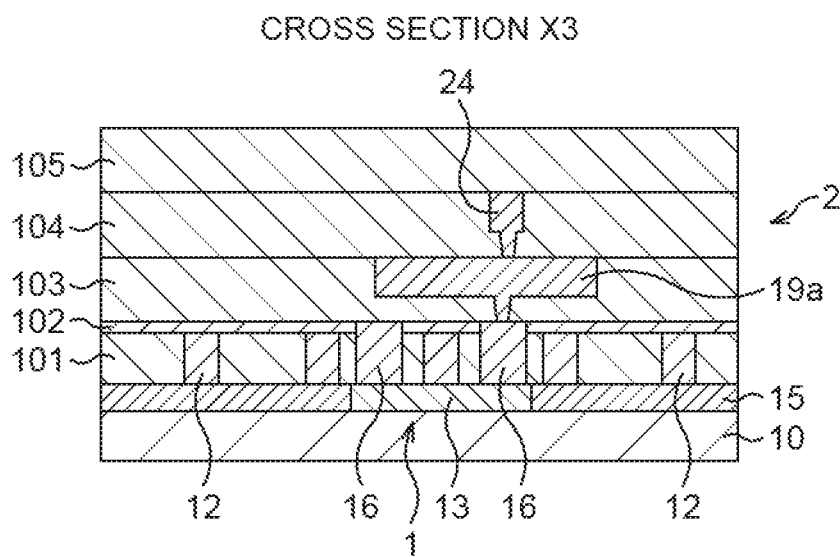

FIG. 1A and FIG. 1B are schematic plan views schematically illustrating a configuration of the CMOS circuit according to the first embodiment. FIG. 1A is a plan view illustrating active regions and gates of a standard cell and local interconnect layers to a first layer of a multilayer wiring structure, and FIG. 1B is a plan view illustrating the gates of the standard cell and a second layer and a third layer of the multilayer wiring structure. FIG. 2A and FIG. 2B are views of various cross sections of the active regions and the gates to the third layer of FIG. 1A and FIG. 1B, and FIG. 2A is a cross-sectional view taken along a broken line Y1-Y1, and FIG. 2B is a cross-sectional view taken along a broken line Y2-Y2. FIG. 3A to FIG. 3C are views of various cross sections of the active regions and the gates to the third layer of FIG. 1A and FIG. 1B, and FIG. 3A is a cross-sectional view taken along a broken line X1-X1, FIG. 3B is a cross-sectional view taken along a broken line X2-X2, and FIG. 3C is a cross-sectional view taken along a broken line X3-X3.

The CMOS circuit includes a standard cell 1 configured having a CMOS transistor, and a multilayer wiring structure 2 for the standard cell 1, on a semiconductor substrate 10.

The standard cell 1 includes a PMOS transistor 11a and an NMOS transistor 11b. The PMOS transistor 11a includes a gate 12, and an active region 13 where P-type source and drain are formed on both sides of the gate 12 of the semiconductor substrate 10. The NMOS transistor 11b includes a gate 12, and an active region 14 where N-type source and drain are formed on both sides of the gate 12 of the semiconductor substrate 10. The active regions 13, 14 are demarcated by an STI element isolation structure 15. A plurality of gates 12 are arranged side by side along a second direction, namely, a Y-direction here.

On the MOS transistors 11a, 11b, local interconnect (L1) layers 16 electrically connected to the active regions 13, 14 are formed respectively.

The multilayer wiring structure 2 includes a plurality of wiring layers stacked, and a first layer M1, a second layer M2, and a third layer M3 are illustrated in the illustrated example.

The first layer M1 is located above the local interconnect layers 16, includes a plurality of wirings arranged side by side along a first direction, namely, an X-direction here, and includes a first power supply line 17 being a Vdd power supply wiring and a second power supply line 18 being a Vss power supply wiring. The first layer M1 includes a first signal line 19a connected to one of the local interconnect layers 16. The first layer M1 includes a second signal line 19b connected to one of the gates 12. The first layer M1 includes a third signal line 19c connected to one of the local interconnect layers 16, which is different from the local interconnect layer 16 connected with the first signal line 19a.

The third layer M3 includes a plurality of wirings arranged side by side along the first direction as with the wirings of the first layer M1, namely, the X-direction here.

As illustrated in FIG. 1A, FIG. 1B, FIG. 2A, and FIG. 3A to FIG. 3C, the third layer M3 includes a third power supply line 31 that is located above the first power supply line 17 and electrically connected to the first power supply line 17 to become a support wiring. The third layer M3 includes a fourth power supply line 32 that is located above the second power supply line 18 and electrically connected to the second power supply line 18 to become a support wiring.

The second layer M2 includes a plurality of wirings arranged side by side along a second direction different from the direction of the wirings of the first layer M1, namely, a Y-direction perpendicular to the X-direction here.

As illustrated in FIG. 1B, FIG. 2A, FIG. 3A, and FIG. 3B, the second layer M2 includes, as a wiring M2A, a first connection wiring 21 that is located above the first power supply line 17 and below the third power supply line 31 and electrically connected to the first power supply line 17 and to the third power supply line 31 and extends in the Y-direction in a plan view. The second layer M2 includes a second connection wiring 22 that is located above the second power supply line 18 and below the fourth power supply line 32 and electrically connected to the second power supply line 18 and to the fourth power supply line 32 and extends in the Y-direction in a plan view. The first connection wiring 21 and the second connection wiring 22 are physically cut from each other, and arranged to line up along a longitudinal direction in a plan view. Between the first connection wiring 21 and the second connection wiring 22 in the wiring M2A, a fourth signal line 23 for the standard cell 1 extending in the Y-direction in a plan view is arranged.

As illustrated in FIG. 1B, FIG. 2B, FIG. 3B, and FIG. 3C, the second layer M2 includes a wiring M2B adjacent to the wiring M2A. In the wiring M2B, a fifth signal line (output wiring) 24 for the standard cell 1 is arranged.

As illustrated in FIG. 1A, FIG. 1B, and FIG. 3B, the third layer M3 includes a first input wiring 33 to the gates 12 of the standard cell 1, which is electrically connected to the fourth signal line 23 of the second layer M2 and to the second signal line 19b of the first layer M1. A signal may be transmitted to the gates 12 of the standard cell 1 via a wiring of a fourth layer on the third layer M3. Alternatively, the first input wiring 33 may be connected to an output wiring for another standard cell. Alternatively, the first input wiring 33 may be provided not in the third layer M3 but in the first layer M1.

[Method for Manufacturing the Semiconductor Device]

Hereinafter, a method of manufacturing the CMOS circuit according to this embodiment will be explained.

First of all, the STI element isolation structure 15 is formed in an element isolation region of the semiconductor substrate 10 made of silicon or the like by the STI (Shallow Trench Isolation) method.

Then, the plurality of gates 12 extending in the Y-direction are formed. Into both sides of the gate 12 of the semiconductor substrate 10, a P-type impurity such as boron (B) or the like is ion-implanted to form source/drain regions in the active region 13. Into both sides of the gate 12 of the semiconductor substrate 10, an N-type impurity such as phosphorus (P) or the like is ion-implanted to form source/drain regions in the active region 14. Thus, the standard cell 1 of the CMOS transistor having the PMOS transistor 11a and NMOS transistor 11b is formed.

Subsequently, a silicon oxide film 101 and a silicon nitride film 102 are deposited, and openings are formed in the silicon oxide film 101 and the silicon nitride film 102. In place of the silicon nitride film 102, a SiC film may be formed. In a manner to fill the openings, tungsten (W) is deposited using titanium nitride (TiN) as a base. The surface of W is polished by the chemical mechanical polishing (CMP) method using the silicon nitride film 102 as a polishing stopper. Thus, the local interconnect layers 16 that fill up the above openings and are electrically connected to the active regions 13, 14 are formed respectively.

Subsequently, the multilayer wiring structure 2 is formed. In this embodiment, wirings of layers included in the multilayer wiring structure 2 are formed, for example, by a so-called double pattering method. In this case, in forming a plurality of layers, for example, a first layer to a seventh layer, the plurality of wirings are formed alternately in the X-direction and in the Y-direction.

A case of performing the double patterning method in forming the wirings of the layers included in the multilayer wiring structure 2 will be explained using FIG. 4A to FIG. 4C and FIG. 5A and FIG. 5B. Right drawings in FIG. 4A to FIG. 5B are plan views and left drawings therein are cross-sectional views. In this embodiment, the wirings are cut into predetermined forms using a cut mask.

Figure 4A:
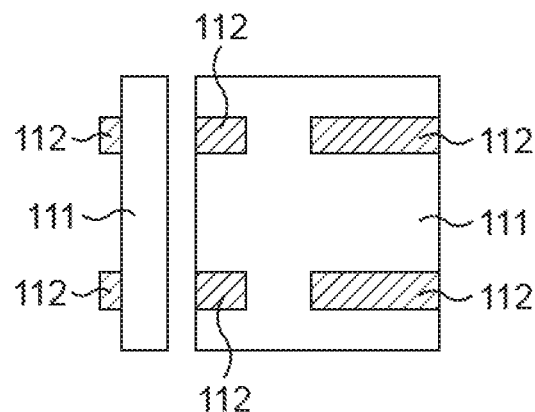
FIG. 4A to FIG. 4C are schematic cross-sectional views illustrating the double patterning method that is performed in forming wirings of layers included in a multilayer wiring structure.

First, as illustrated in FIG. 4A, mandrel patterns 112 extending in a predetermined direction are formed on an insulating layer 111.

Figure 4B:
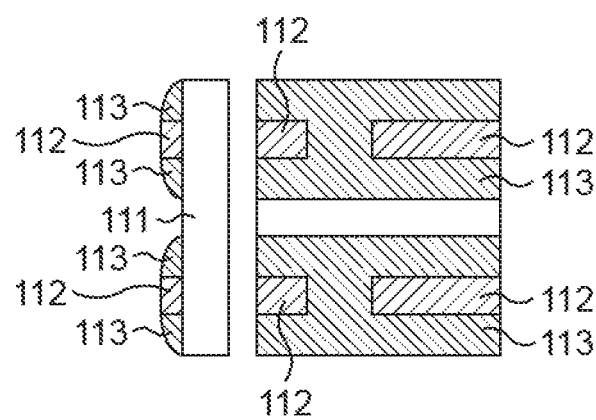

Then, as illustrated in FIG. 4B, an insulating material is deposited on the insulating layer 111, and etchback is performed on its entire surface to leave the insulating material only on side surfaces of the mandrel patterns 112, thereby forming spacer patterns 113.

Figure 4C:
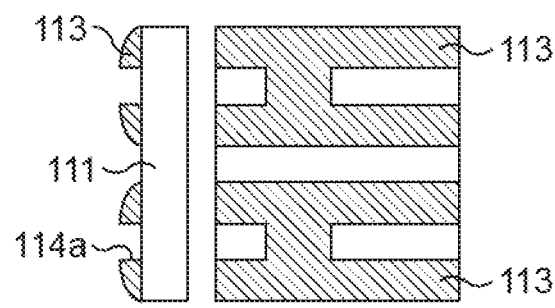

Then, as illustrated in FIG. 4C, wet etching is performed to leave only the mandrel patterns 112, thereby leaving the spacer patterns 113. Thus, wiring trenches 114a formed by removing the mandrel patterns 112 and a wiring trench 114b between the spacer patterns 113 are formed.

Figure 5A:
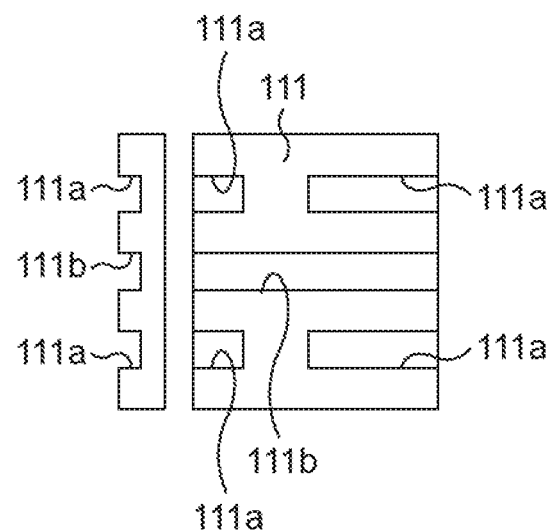
FIG. 5A and FIG. 5B are schematic cross-sectional views illustrating the double patterning method that is performed in forming the wirings of the layers included in the multilayer wiring structure, subsequent to FIG. 4A to FIG. 4C.

Subsequently, as illustrated in FIG. 5A, the insulating layer 111 is etched using the spacer patterns 113 as a mask. Thus, wiring trenches 111a, 111b are formed in the insulating layer 111. Thereafter, the spacer patterns 113 are removed by wet etching.

Figure 5B:
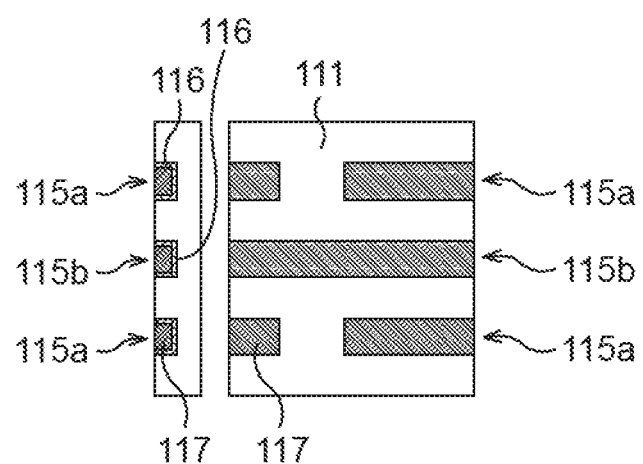

Subsequently, as illustrated in FIG. 5B, wirings 115a, 115b are formed by a damascene method. The wirings 115a are each formed of a barrier layer 116 such as tantalum (Ta) or tantalum nitride (TaN) covering an inner wall surface of the wiring trench 111a and copper (Cu) 117 filling the wiring trench 111a on the barrier layer 116. The wiring 115b is formed of a barrier layer 116 such as Ta or TaN covering an inner wall surface of the wiring trench 111b and Cu 117 filling the wiring trench 111b on the barrier layer 116.

In this embodiment, the first layer to third layer of the multilayer wiring structure 2 will be explained using an example.

First of all, the first layer M1 is formed.

A plurality of wirings that extend to the X-direction are formed in a silicon oxide film 103 using the double patterning method. In the first layer M1, the first power supply line 17 being a Vdd power supply wiring and the second power supply line 18 being a Vss power supply wiring which are electrically connected to the local interconnect layers 16 through vias, are provided.

Subsequently, the second layer M2 is formed.

A plurality of wirings that extend to the Y-direction are formed in a silicon oxide film 104 using the double patterning method. In the second layer M2, the first connection wiring 21, the fourth signal line 23, and the second connection wiring 22 which are cut at predetermined locations, for example, inside the standard cell 1, are provided as the wiring M2A. Further, the fifth signal line 24 is provided as the wiring M2B adjacent to the wiring M2A. The first connection wiring 21 is electrically connected to the first power supply line 17 of the first layer M1. The second connection wiring 22 is electrically connected to the second power supply line 18 of the first layer M1.

Subsequently, the third layer M3 is formed.

A plurality of wirings that extend to the X-direction are formed in a silicon oxide film 105 using the double patterning method. In the third layer M3, the third power supply line 31 that is located above the first power supply line 17 of the first layer M1 and electrically connected to the first power supply line 17 via the first connection wiring 21 of the second layer M2 to become a support wiring is provided. The fourth power supply line 32 that is located above the second power supply line 18 of the first layer M1 and electrically connected to the second power supply line 18 via the second connection wiring 22 of the second layer M2 to become a support wiring is provided. Further, the first input wiring 33 to the gates 12 of the standard cell 1, which is electrically connected to the fourth signal line 23 of the second layer M2 and to the second signal line 19b of the first layer M1, is provided.

In this embodiment, in the configuration in which the wirings are formed in the X-direction or in the Y-direction alternately for each layer using, for example, the double patterning method, the support wiring for the first power supply line 17 of the first layer M1 is formed as the third power supply line 31 of the third layer M3, and the support wiring for the second power supply line 18 of the first layer M1 is formed as the fourth power supply line 32 of the third layer M3. This configuration realizes a highly-reliable CMOS circuit which enables achievement of microfabrication of the multilayer wiring structure 2 and suppression of occurrence of EM.

Further, in forming the wirings of the second layer M2, for example, the wiring M2A is formed by using the mandrel pattern and the wiring M2B is formed by using the spacer pattern. In this case, the wiring M2A is cut inside the standard cell, so that the fourth signal line 23 for the standard cell 1 extending in the Y-direction in a plan view is arranged between the first connection wiring 21 and the second connection wiring 22. This configuration enables effective utilization of a space between wirings and therefore contributes to further microfabrication of the multilayer wiring structure. The occupied area by the wiring can be suppressed, for example, to about ¾ of that in the case where the wiring M2A is cut at the boundary with the standard cell 1, despite the same function. Note that the wiring M2A may be formed by using the spacer pattern, and the wiring M2B may be formed by using the mandrel pattern.

In this embodiment, a wiring region isolated from the fourth signal line 23 is formed on the wiring M2A. This wiring is connected to the power supply line of the first layer M1 below the wiring through the via and to the power supply line of the third layer M3 above the wiring through the via. This enables a dissipation path that releases heat conducted to the second layer M2 to be arranged near, for example, a heat generation source such as a transistor that may cause self-heating, thereby improving EM resistance and IR-drop of the signal lines and the power supply lines. The length of the wiring M2A (lengths of the first and second connection wirings 21, 22) being the dissipation path becomes a fixed value of about 50 nm to 100 nm when the height of the standard cell 1 (the distance between the first power supply line 17 and the second power supply line 18) is about 300 nm. This dissipation path can also protect the signal lines and the power supply lines of the CMOS transistor from heat conduction from the outside when a heat generation source such as a current source is located therearound.

Second Embodiment

Next, a second embodiment will be explained. In this embodiment, a NAND circuit is exemplified as the semiconductor device.

Figure 6A:
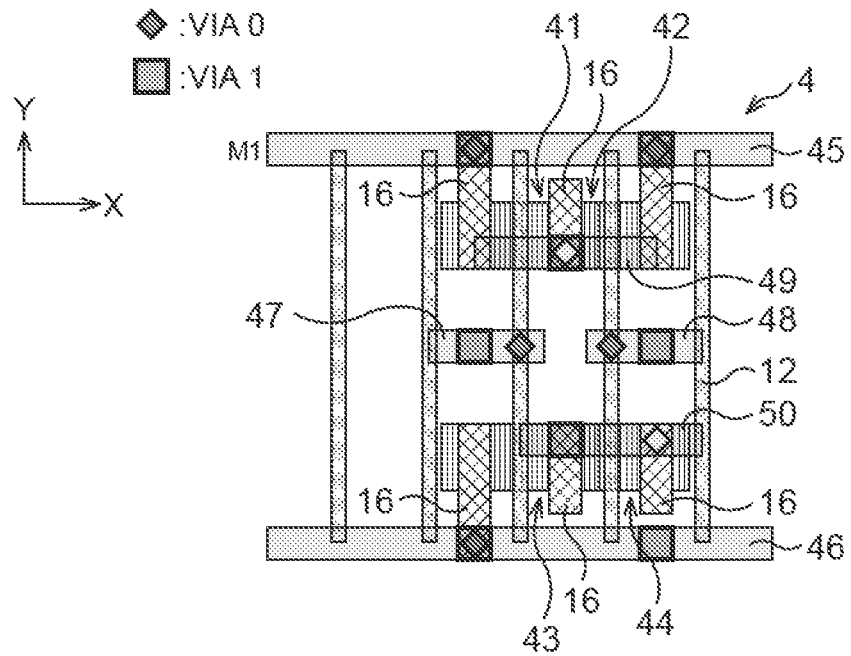
FIG. 6A and FIG. 6B are schematic plan views schematically illustrating a configuration of a NAND circuit according to a second embodiment.
Figure 6B:
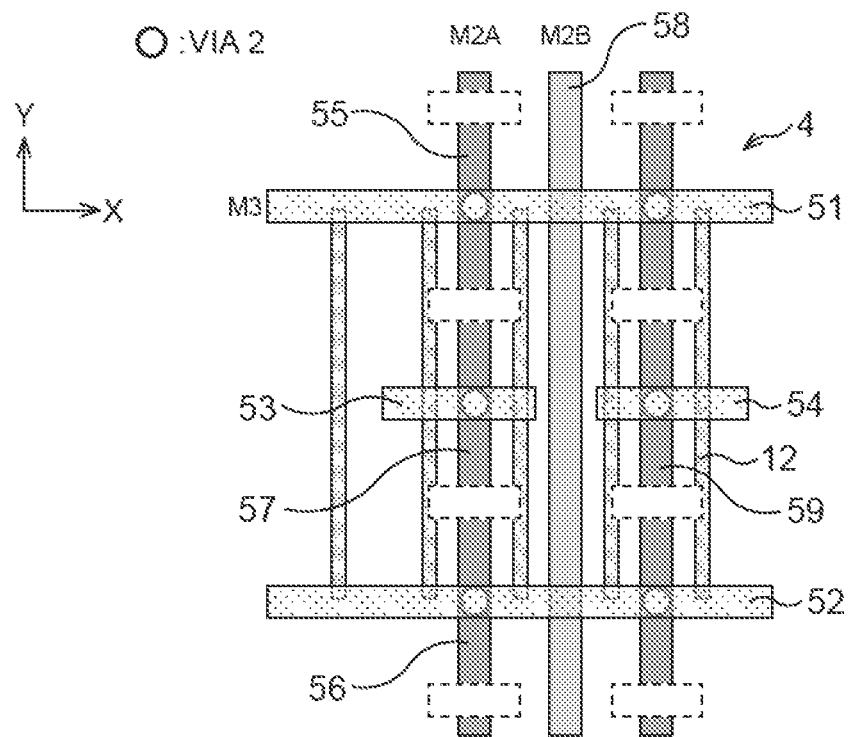
Figure 7:
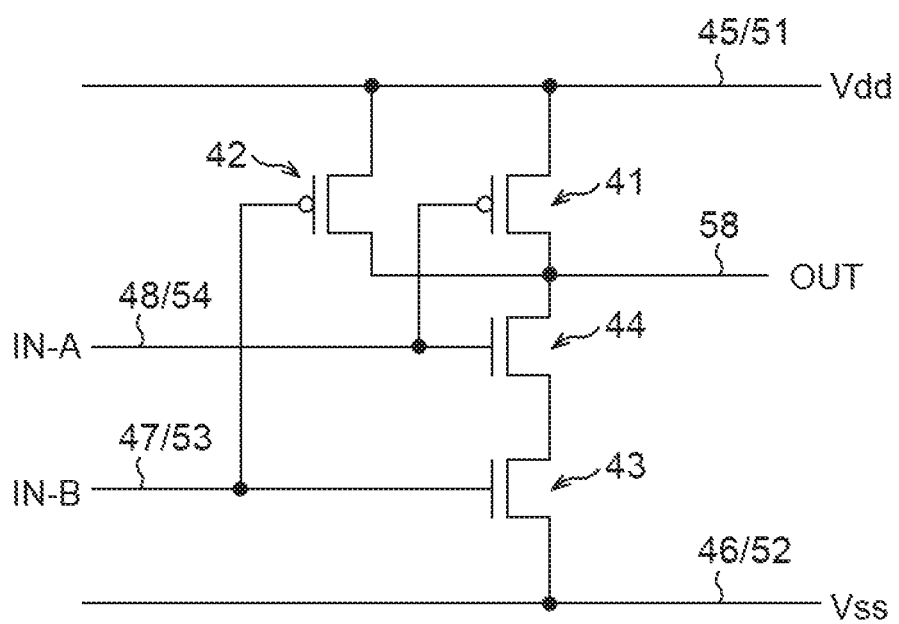
FIG. 7 is a schematic diagram illustrating an equivalent circuit configuration of the NAND circuit according to the second embodiment.

FIG. 6A and FIG. 6B are schematic plan views schematically illustrating a configuration of the NAND circuit according to the second embodiment. FIG. 6A is a plan view illustrating active regions and gates of a standard cell and local interconnect layers to a first layer of a multilayer wiring structure, and FIG. 6B is a plan view illustrating the gates of the standard cell and a second layer and a third layer of the multilayer wiring structure. FIG. 7 is a schematic diagram illustrating an equivalent circuit configuration of the NAND circuit.

The NAND circuit includes PMOS transistors 41, 42 and NMOS transistors 43, 44 of the standard cell, and a multilayer wiring structure 4 for the MOS transistors 41 to 44, on a semiconductor substrate.

On the MOS transistors 41 to 44, local interconnect layers 16 electrically connected to the active regions are formed respectively.

The multilayer wiring structure 4 includes a plurality of wiring layers stacked, and a first layer M1, a second layer M2, and a third layer M3 are illustrated in the illustrated example.

The first layer M1 is located above the local interconnect layers 16 and includes a plurality of wirings arranged side by side along a first direction, namely, an X-direction here. The first layer M1 includes a first power supply line 45 being a Vdd power supply wiring, a second power supply line 46 being a Vss power supply wiring, a first signal line 47, a second signal line 48, a third signal line 49, and a fourth signal line 50.

The third layer M3 includes a plurality of wirings arranged side by side along the first direction as with the wirings of the first layer M1, namely, the X-direction here.

The third layer M3 includes a third power supply line 51 that is located above the first power supply line 45 and electrically connected to the first power supply line 45 to become a support wiring. The third layer M3 includes a fourth power supply line 52 that is located above the second power supply line 46 and electrically connected to the second power supply line 46 to become a support wiring. The third layer M3 includes a first input wiring 53 electrically connected to the first signal line 47, and a second input wiring 54 electrically connected to the second signal line 48.

The second layer M2 includes a plurality of wirings arranged side by side along a second direction different from the direction of the wirings of the first layer M1, namely, a Y-direction perpendicular to the X-direction here.

The second layer M2 includes, as a wiring M2A, a first connection wiring 55 that is located above the first power supply line 45 and below the third power supply line 51 and electrically connected to the first power supply line 45 and to the third power supply line 51 and extends in the Y-direction in a plan view. The second layer M2 includes a second connection wiring 56 that is located above the second power supply line 46 and below the fourth power supply line 52 and electrically connected to the second power supply line 46 and to the fourth power supply line 52 and extends in the Y-direction in a plan view. The first connection wiring 55 and the second connection wiring 56 are physically cut from each other, and arranged to line up along a longitudinal direction in a plan view. Between the first connection wiring 55 and the second connection wiring 56 in the wiring M2A, a fifth signal line 57 for the standard cell extending in the Y-direction in a plan view is arranged. Further, a sixth signal line 59 connected to the second input wiring 54 is arranged in the wiring M2A.

The second layer M2 includes a wiring M2B adjacent to the wiring M2A. The wiring M2B is electrically connected to the third signal line 49 and to the fourth signal line 50 of the first layer M1 and becomes an output wiring 58.

In this embodiment, in the configuration in which the wirings are formed in the X-direction or in the Y-direction alternately for each layer using, for example, the double patterning method, the support wiring for the first power supply line 45 of the first layer M1 is formed as the third power supply line 51 of the third layer M3, and the support wiring for the second power supply line 46 of the first layer M1 is formed as the fourth power supply line 52 of the third layer M3. This configuration realizes a highly-reliable NAND circuit which enables achievement of microfabrication of the multilayer wiring structure and suppression of occurrence of EM.

Further, in forming the wirings of the second layer M2, for example, the wiring M2A is formed by using the mandrel pattern and the wiring M2B is formed by using the spacer pattern. In this case, the wiring M2A is cut inside the standard cell, and the fifth signal line 57 for the standard cell extending in the Y-direction in a plan view is arranged between the first connection wiring 55 and the second connection wiring 56. This configuration enables effective utilization of a space between wirings and therefore contributes to further microfabrication of the multilayer wiring structure 4. Note that the wiring M2A may be formed by using the spacer pattern, and the wiring M2B may be formed by using the mandrel pattern.

Third Embodiment

Next, a third embodiment will be explained. In this embodiment, a CMOS circuit is exemplified as the semiconductor device as in the first embodiment, but is different from the first embodiment in that the CMOS circuit is a so-called fin-type MOS transistor (FinFET).

Figure 8A:
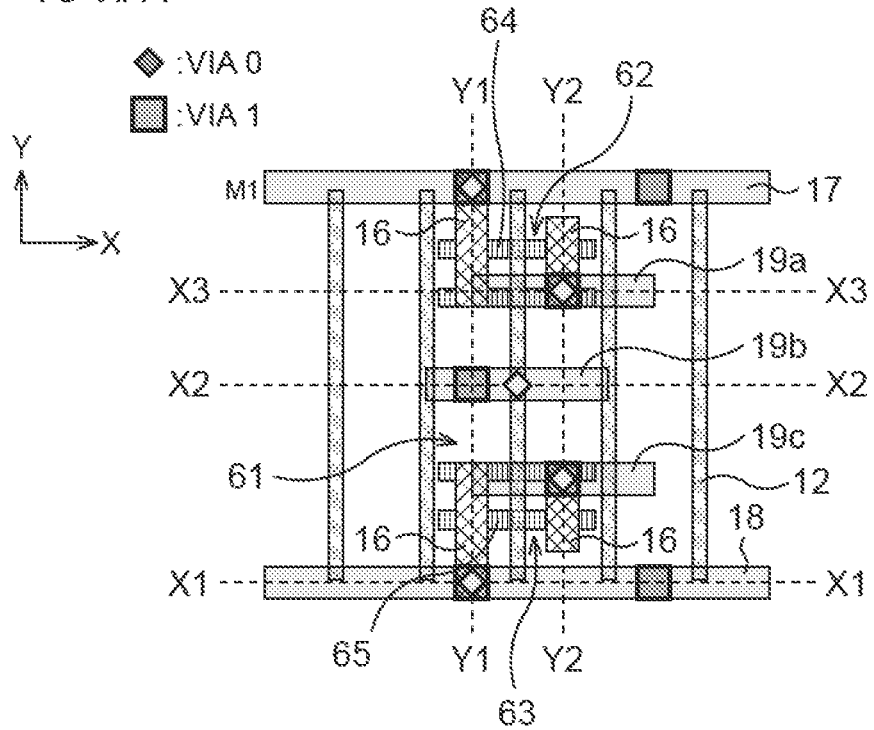
FIG. 8A and FIG. 8B are schematic plan views schematically illustrating a configuration of a CMOS circuit according to a third embodiment.
Figure 8B:
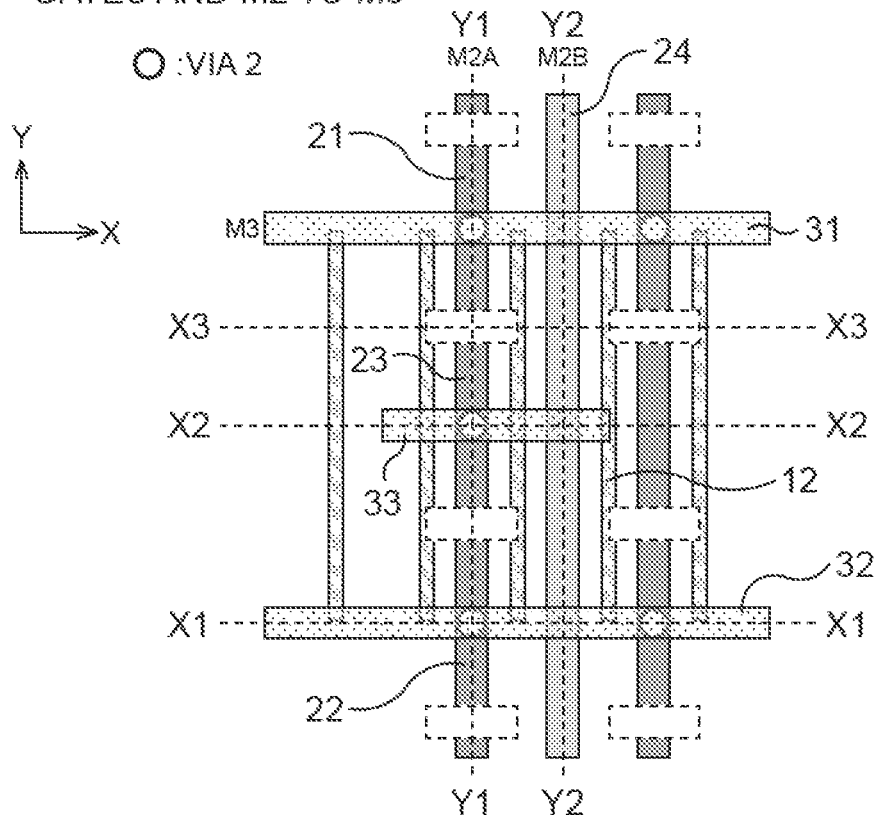
Figure 9A:
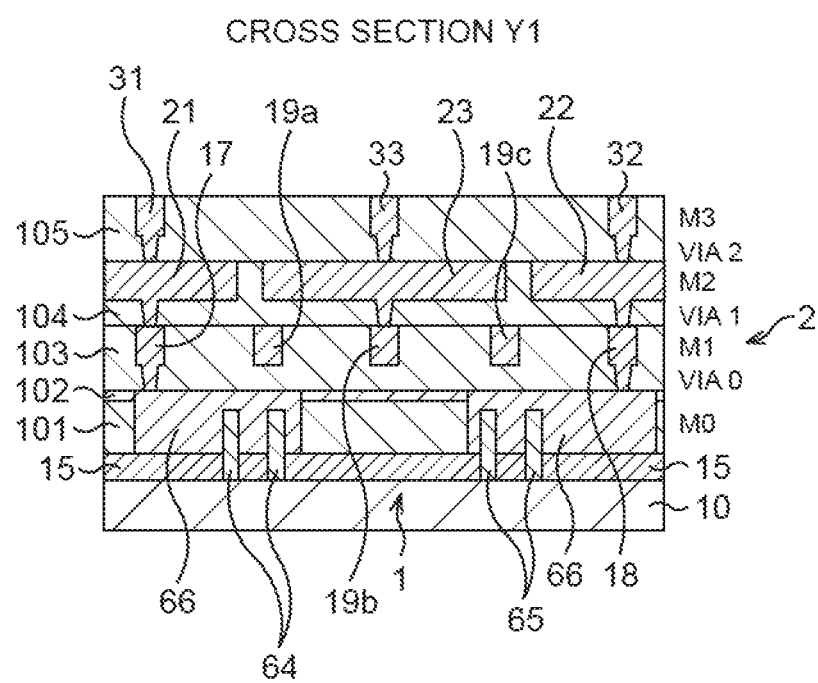
FIG. 9A and FIG. 9B are cross-sectional views taken along a Y-direction in FIG. 8A and FIG. 8B.
Figure 9B:
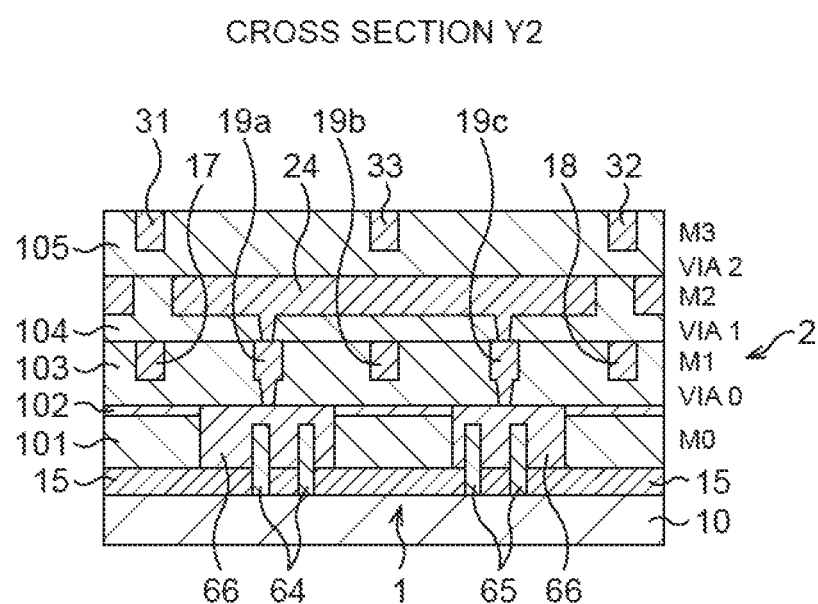
Figure 10A:
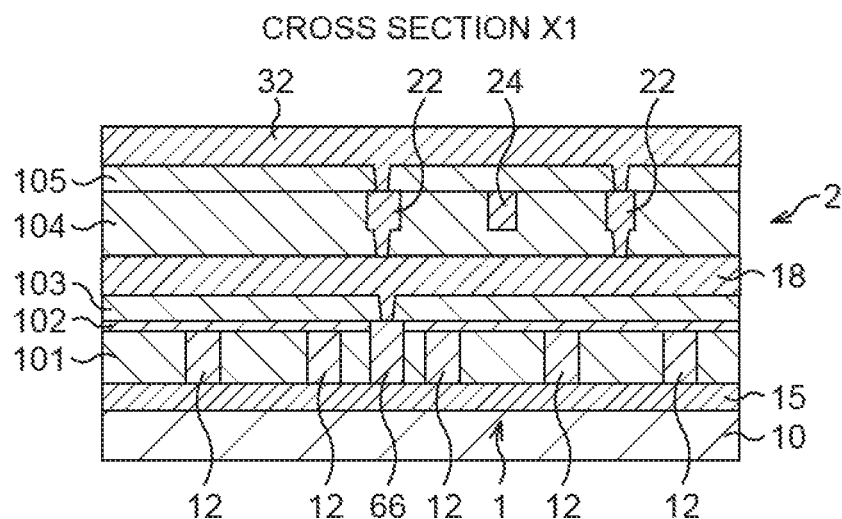
FIG. 10A to FIG. 10C are cross-sectional views taken along an X-direction in FIG. 8A and FIG. 8B.
Figure 10B:
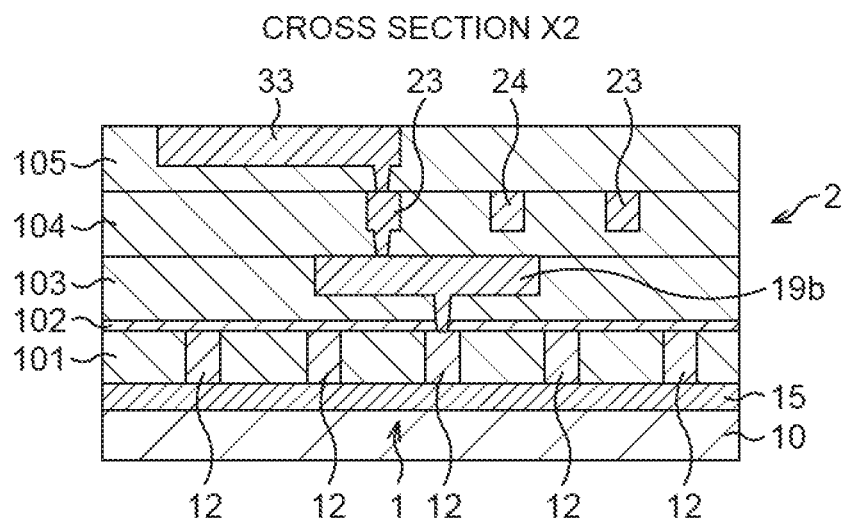
Figure 10C:
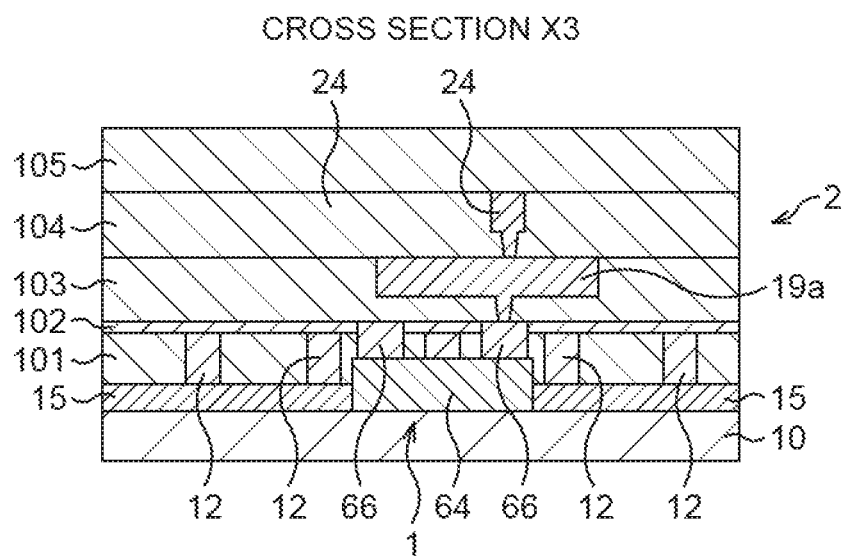

FIG. 8A and FIG. 8B are schematic plan views schematically illustrating a configuration of the CMOS circuit according to the third embodiment. FIG. 8A is a plan view illustrating active regions and gates of a standard cell and local interconnect layers to a first layer of a multilayer wiring structure, and FIG. 8B is a plan view illustrating the gates of the standard cell and a second layer and a third layer of the multilayer wiring structure. FIG. 9A and FIG. 9B are views of various cross sections of the active regions and the gates to the third layer of FIG. 8A and FIG. 8B, and FIG. 9A is a cross-sectional view taken along a broken line Y1-Y1, and FIG. 9B is a cross-sectional view taken along a broken line Y2-Y2. FIG. 10A to FIG. 10C are views of various cross sections of the active regions and the gates to the third layer of FIG. 8A and FIG. 8B, and FIG. 10A is a cross-sectional view taken along a broken line X1-X1, FIG. 10B is a cross-sectional view taken along a broken line X2-X2, and FIG. 10C is a cross-sectional view taken along a broken line X3-X3. Note that the same components and the like as those in the first embodiment are denoted by the same numerals.

The CMOS circuit includes a standard cell 61 configured having a CMOS transistor and a multilayer wiring structure 2 for the standard cell 61, on a semiconductor substrate 10.

The standard cell 61 includes a P-type FinFET 62 being a PMOS transistor and an N-type FinFET 63 being an NMOS transistor. The P-type Fin FET 62 includes a gate 12, and a fin-shaped active region 64 where P-type source/drain regions are formed on both sides of the gate 12 of the semiconductor substrate 10. The N-type FinFET 63 includes a gate 12 and a fin-shaped active region 65 where N-type source/drain regions are formed on both sides of the gate 12 of the semiconductor substrate 10. The active regions 64, 65 are formed by etching the surface of the semiconductor substrate 10, and demarcated by an STI element isolation structure 15. A plurality of gates 12 are arranged side by side along a second direction, namely, a Y-direction here.

On the FinFETs 62, 63, local interconnect layers 16 electrically connected to the active regions 64, 65 are formed respectively.

The multilayer wiring structure 2 includes a plurality of wiring layers stacked, and a first layer M1, a second layer M2, and a third layer M3 are illustrated in the illustrated example.

The first layer M1 is located above the local interconnect layers 16, includes a plurality of wirings arranged side by side along a first direction, namely, an X-direction here, and includes a first power supply line 17 being a Vdd power supply wiring and a second power supply line 18 being a Vss power supply wiring. The first layer M1 includes a first signal line 19a connected to one of the local interconnect layers 16. The first layer M1 includes a second signal line 19b connected to one of the gates 12. The first layer M1 includes a third signal line 19c connected to one of the local interconnect layers 16, which is different from the local interconnect layer 16 connected with the first signal line 19a.

The third layer M3 includes a plurality of wirings arranged side by side along the first direction as with the wirings of the first layer M1, namely, the X-direction here.

The third layer M3 includes a third power supply line 31 that is located above the first power supply line 17 and electrically connected to the first power supply line 17 to become a support wiring. The third layer M3 includes a fourth power supply line 32 that is located above the second power supply line 18 and electrically connected to the second power supply line 18 to become a support wiring.

The second layer M2 includes a plurality of wirings arranged side by side along a second direction different from the direction of the wirings of the first layer M1, namely, a Y-direction perpendicular to the X-direction here.

The second layer M2 includes, as a wiring M2A, a first connection wiring 21 that is located above the first power supply line 17 and below the third power supply line 31 and electrically connected to the first power supply line 17 and to the third power supply line 31 and extends in the Y-direction in a plan view. The second layer M2 includes a second connection wiring 22 that is located above the second power supply line 18 and below the fourth power supply line 32 and electrically connected to the second power supply line 18 and to the fourth power supply line 32 and extends in the Y-direction in a plan view. The first connection wiring 21 and the second connection wiring 22 are physically cut from each other, and arranged to line up along a longitudinal direction in a plan view. Between the first connection wiring 21 and the second connection wiring 22 in the wiring M2A, a fourth signal line 23 for the standard cell 61 extending in the Y-direction in a plan view is arranged.

The second layer M2 includes a wiring M2B adjacent to the wiring M2A. In the wiring M2B, a fifth signal line (output wiring) 24 for the standard cell 61 is arranged.

The third layer M3 includes a first input wiring 33 to the gates 12 of the CMOS transistor 1, which is electrically connected to the fourth signal line 23 of the second layer M2 and to the second signal line 19b of the first layer M1. A signal may be transmitted to the gates 12 of the standard cell 61 via a wiring of a fourth layer on the third layer M3. Alternatively, the first input wiring 33 may be connected to an output wiring for another standard cell. Alternatively, the first input wiring 33 may be provided not in the third layer M3 but in the first layer M1.

In this embodiment, in the configuration in which the wirings are formed in the X-direction or in the Y-direction alternately for each layer using, for example, the double patterning method, the support wiring for the first power supply line 17 of the first layer M1 is formed as the third power supply line 31 of the third layer M3, and the support wiring for the second power supply line 18 of the first layer M1 is formed as the fourth power supply line 32 of the third layer M3. This configuration realizes a highly-reliable CMOS circuit which enables achievement of microfabrication of the multilayer wiring structure 2 and suppression of occurrence of EM.

Further, in forming the wirings of the second layer M2, for example, the wiring M2A is formed by using the mandrel pattern and the wiring M2B is formed by using the spacer pattern. In this case, the wiring M2A is cut inside the standard cell 61, so that the fourth signal line 23 for the standard cell 61 extending in the Y-direction in a plan view is arranged between the first connection wiring 21 and the second connection wiring 22. This configuration enables effective utilization of a space between wirings and therefore contributes to further microfabrication of the multilayer wiring structure 2. Note that the wiring M2A may be formed by using the spacer pattern, and the wiring M2B may be formed by using the mandrel pattern.

Fourth Embodiment

Next, a fourth embodiment will be explained. In this embodiment, a CMOS circuit is exemplified as the semiconductor device as in the first embodiment, but is different from the first embodiment in that the configuration of the standard cell and the configuration of the multilayer wiring structure are different.

Figure 11:
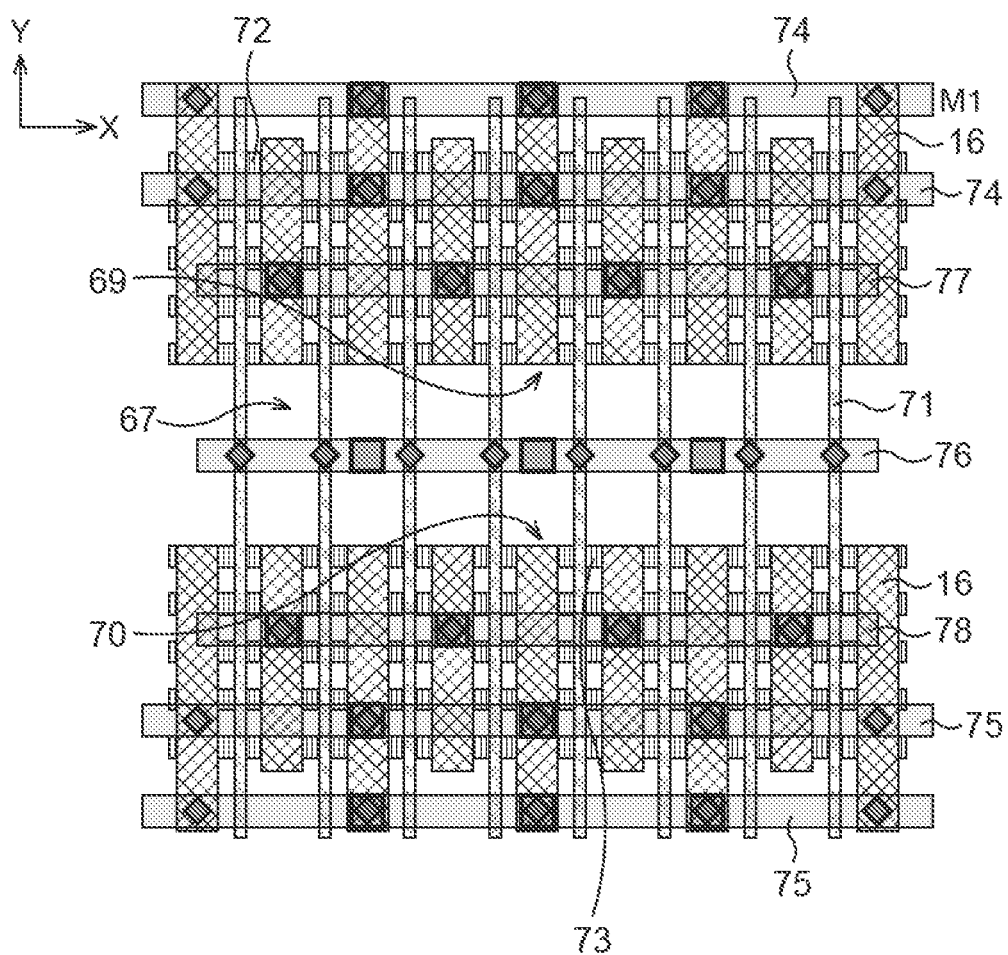
FIG. 11 is a schematic plan view schematically illustrating a configuration of a CMOS circuit according to a fourth embodiment.
Figure 12:
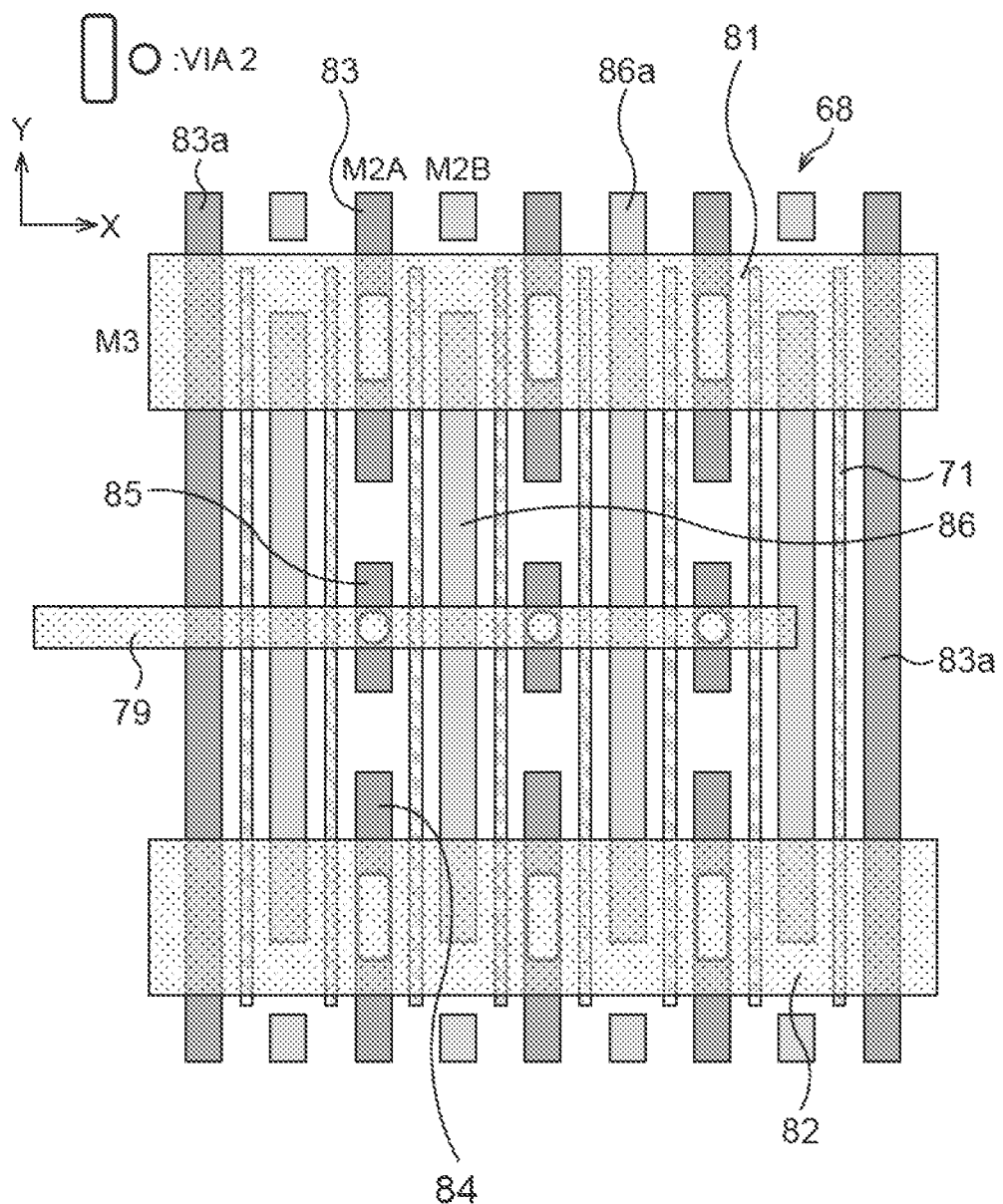
FIG. 12 is a schematic plan view schematically illustrating the configuration of the CMOS circuit according to the fourth embodiment.
Figure 13:
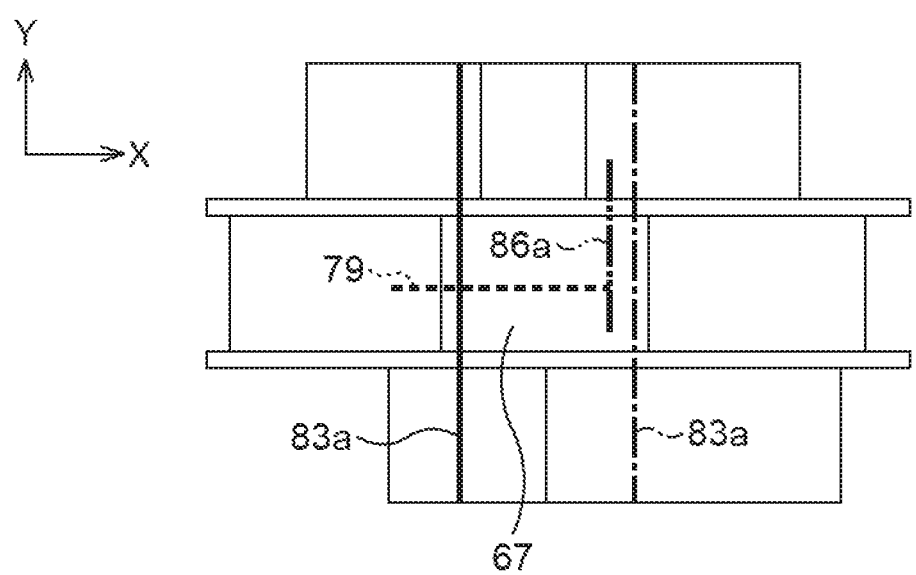
FIG. 13 is a schematic plan view illustrating a plurality of adjacent standard cells in the CMOS circuit according to the fourth embodiment.

FIG. 11 to FIG. 13 are schematic plan views schematically illustrating a configuration of the CMOS circuit according to the fourth embodiment. FIG. 11 is a plan view illustrating active regions and gates of a standard cell and local interconnect layers to a first layer of a multilayer wiring structure, and FIG. 12 is a plan view illustrating the gates of the standard cell and a second layer and a third layer of the multilayer wiring structure. FIG. 13 is a schematic plan view illustrating a plurality of adjacent standard cells.

The CMOS circuit includes a standard cell 67 configured having a CMOS transistor and a multilayer wiring structure 68 for the standard cell 67, on a semiconductor substrate.

The standard cell 67 includes a PMOS transistor 69 and an NMOS transistor 70. The PMOS transistor 69 includes a gate 71, and an active region 72 extending in a band shape where P-type source/drain regions are formed on both sides of the gate 71 of the semiconductor substrate. The NMOS transistor 70 includes a gate 71, and an active region 73 extending in a band shape where N-type source/drain regions are formed on both sides of the gate 71 of the semiconductor substrate. A plurality of gates 71 are arranged side by side along a second direction, namely, a Y-direction here. A plurality of active regions 72 are arranged side by side along a first direction, namely, an X-direction here. A plurality of active regions 73 are arranged side by side along the first direction, namely, the X-direction here.

On the MOS transistors 69, 70, local interconnect layers 16 electrically connected to the active regions 72, 73 are formed respectively.

The multilayer wiring structure 68 includes a plurality of wiring layers stacked, and a first layer M1, a second layer M2, and a third layer M3 are illustrated in the illustrated example.

The first layer M1 is located above the local interconnect layers, and includes a plurality of wirings arranged side by side along the first direction, namely, the X-direction here. The first layer M1 includes first power supply lines 74 being Vdd power supply wirings, second power supply lines 75 being Vss power supply wirings, a first signal line 76, a second signal line 77, a third signal line 78, and an input wiring 79. The first signal line 76 is electrically connected to the gates 71, and the second signal line 77 and the third signal line 78 are electrically connected to the drains of the active regions 72, 73 respectively. The input wiring 79 may be connected to an output wiring for another standard cell that is located on the left side as illustrated in FIG. 13. Besides, the second signal line 77 and the third signal line 78 may be extended to the left side in FIG. 11 and connected to another standard cell that is located on the left side.

The third layer M3 includes a plurality of wirings arranged side by side along the first direction as with the wirings of the first layer M1, namely, the X-direction here.

The third layer M3 includes a third power supply line 81 that is located above the first power supply lines 74 and electrically connected to the first power supply lines 74 to become a support wiring. The third layer M3 includes a fourth power supply line 82 that is located above the second power supply lines 75 and electrically connected to the second power supply lines 75 to become a support wiring. At least one of the third power supply line 81 and the fourth power supply line 82 or, both of the third power supply line 81 and the fourth power supply line 82 in this embodiment are formed to be wider than other wirings of the third layer M3, for example, the input wiring 79.

In a cell with large driving force like the standard cell 67, self-heating is large in the PMOS transistor 69 and the NMOS transistor 70 in some cases. A wiring region isolated from fifth signal lines 85 formed on the M2A forms a dissipation path that releases heat conducted to the M2, to the M3 and above. Forming the third power supply line 81 and the fourth power supply line 82 wider makes it possible to enhance the heat dissipation effect. Note that the third power supply line 81 may be wider than the first power supply line 74, and may be arranged to be superposed on the plurality of first power supply lines 74. Further, the fourth power supply line 82 may be wider than the second power supply line 75, and may be arranged to be superposed on the plurality of second power supply lines 75.

As compared with a via 2 connecting the input wiring 79 and the fifth signal line 85, a via 2 connecting the third power supply line 81 and the first connection wiring 83 and a via 2 connecting the fourth power supply line 82 and the second connection wiring 84 extend in the Y-direction. Therefore, a contact area between the via 2 under the third power supply line 81 and the first connection wiring 83 and a contact area between the via 2 under the fourth power supply line 82 and the second connection wiring 84 are larger than a contact area between the via 2 under the input wiring 79 and the fifth signal line 85. This configuration enables effective dissipation of the heat generated from the MOS transistors. Note that as the via 2 under the third power supply line 81 or under the fourth power supply line 82, one or a plurality of vias having the same size as that of the via 2 under the input wiring 79 may be arranged. The via having the same size mentioned here means the via formed based on the same design dimension and includes a via varying in size due to variation in manufacture.

The second layer M2 includes a plurality of wirings arranged side by side along a second direction different from the direction of the wirings of the first layer M1, namely, a Y-direction perpendicular to the X-direction here.

The second layer M2 includes, as a wiring M2A, first connection wirings 83 that are located above the first power supply lines 74 and below the third power supply line 81 and electrically connected to the first power supply lines 74 and to the third power supply line 81 and extend in the Y-direction in a plan view. The second layer M2 includes fourth signal lines 83a that are located above the first power supply lines 74 and below the third power supply line 81 and arranged, for example, on both ends of the standard cell 67. The signal lines 83a connect a plurality of standard cells adjacent to the standard cell 67. The second layer M2 includes second connection wirings 84 that are located above the second power supply lines 75 and below the fourth power supply line 82 and electrically connected to the second power supply lines 75 and to the fourth power supply line 82 and extend in the Y-direction in a plan view. The first connection wiring 83 and the second connection wiring 84 are physically cut from each other, and arranged to line up along a longitudinal direction in a plan view. Between the first connection wiring 83 and the second connection wiring 84 in the wiring M2A, the fifth signal line 85 for the standard cell 67 extending in the Y-direction in a plan view is arranged. The fifth signal line 85 is electrically connected to the first signal line 76 and the input wiring 79 of the first layer M1. Note that the fourth signal lines 83a may be arranged not only at both ends of the standard cell 67 but also at the inside of the standard cell 67. Further, the fourth signal lines 83a may be connected to other standard cells or circuits which are not adjacent to the standard cell 67.

The second layer M2 includes a wiring M2B adjacent to the wiring M2A. In the wiring M2B, a sixth signal line 86 of the standard cell 67 is arranged to be physically cut at a location different from that of the first connection wiring 83 and the second connection wiring 84. The second layer M2 includes an output wiring 86a. The output wiring 86a may be connected to the input wiring for another adjacent standard cell 67.

In this embodiment, in the configuration in which the wirings are formed in the X-direction or in the Y-direction alternately for each layer using, for example, the double patterning method, the support wiring for the first power supply lines 74 of the first layer M1 is formed as the third power supply line 81 of the third layer M3, and the support wiring for the second power supply lines 75 of the first layer M1 is formed as the fourth power supply line 82 of the third layer M3. This configuration realizes a highly-reliable CMOS circuit which enables achievement of microfabrication of the multilayer wiring structure 68 and suppression of occurrence of EM.

Further, in forming the wirings of the second layer M2, for example, the wiring M2A is formed by using the mandrel pattern and the wiring M2B is formed by using the spacer pattern. In this case, the wiring M2A is cut inside the standard cell, and the fifth signal line 85 for the standard cell 67 extending in the Y-direction in a plan view is arranged between the first connection wiring 83 and the second connection wiring 84. This configuration enables effective utilization of a space between wirings and therefore contributes to further microfabrication of the multilayer wiring structure. Note that the wiring M2A may be formed by using the spacer pattern, and the wiring M2B may be formed by using the mandrel pattern.

Also in this embodiment, the MOS transistors may be configured as FinFETs as in the third embodiment. In this case, it is preferable to connect the wirings of the second layer M2 to the local interconnect layers located on fin-shaped active regions in order to release the heat generated from the FinFETs.

Fifth Embodiment

Next, a fifth embodiment will be explained. In this embodiment, a CMOS circuit is exemplified as the semiconductor device as in the first embodiment, but is different from the first embodiment in that the CMOS circuit is a MOS transistor (nanowire FET) in a so-called nanowire structure with a channel portion formed in a wire shape.

Figure 14A:
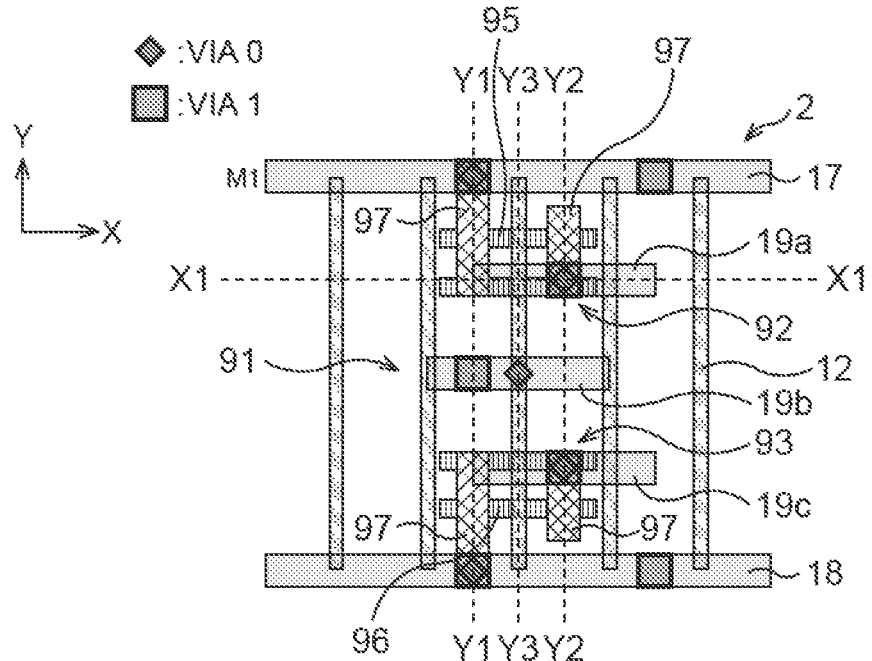
FIG. 14A and FIG. 14B are schematic plan views schematically illustrating a configuration of a CMOS circuit according to a fifth embodiment.
Figure 14B:
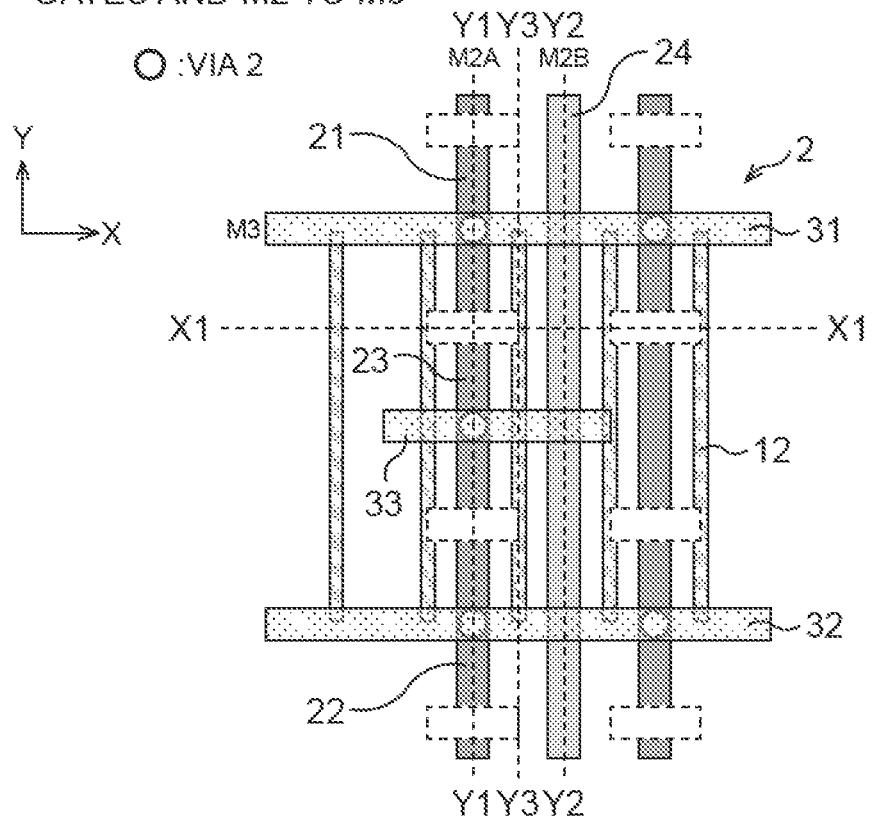
Figure 15A:
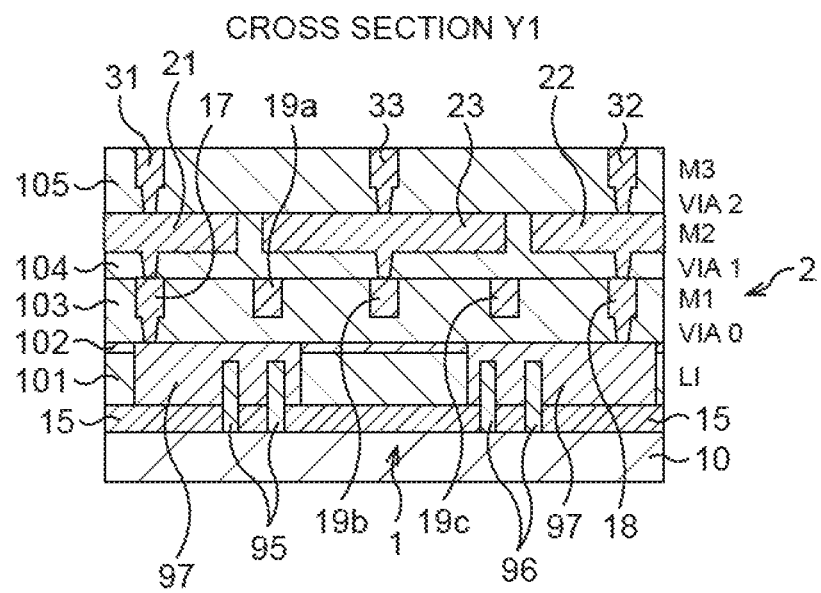
FIG. 15A to FIG. 15C are schematic cross-sectional views taken along a Y-direction in FIG. 14A and FIG. 14B.
Figure 15B:
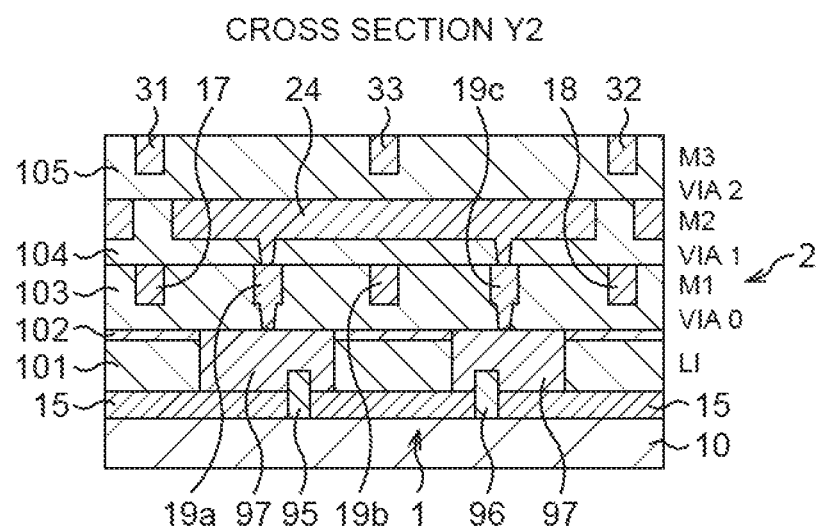
Figure 15C:
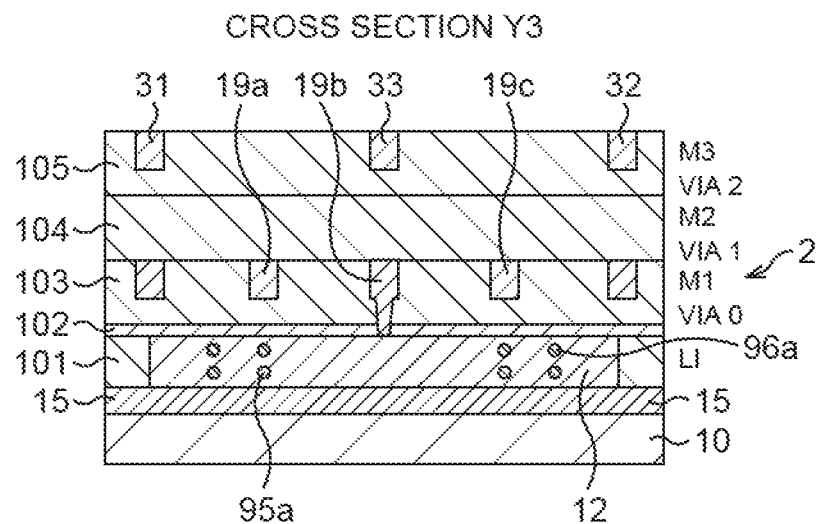
Figure 16:
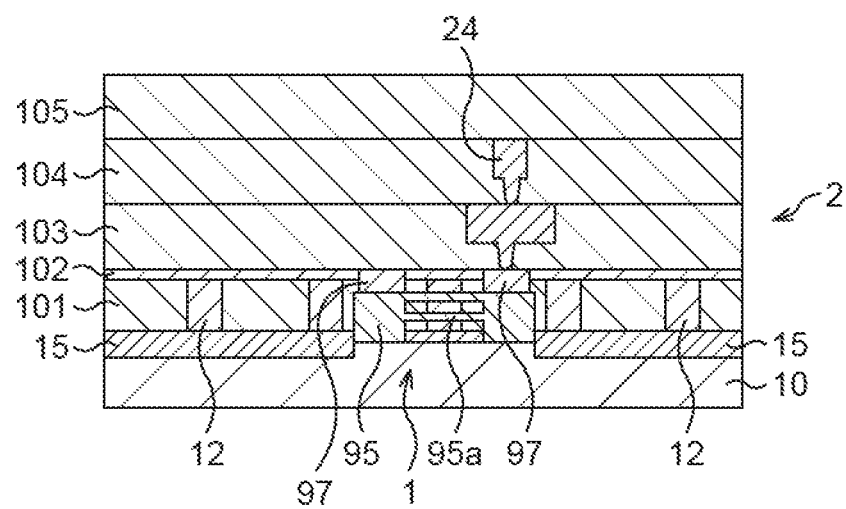
FIG. 16 is a schematic cross-sectional view taken along an X-direction in FIG. 14A and FIG. 14B.

FIG. 14A and FIG. 14B are schematic plan views schematically illustrating a configuration of the CMOS circuit according to the fifth embodiment. FIG. 14A is a plan view illustrating active regions and gates of a standard cell and local interconnect layers to a first layer of a multilayer wiring structure, and FIG. 14B is a plan view illustrating the gates of the standard cell and a second layer and a third layer of the multilayer wiring structure. FIG. 15A to FIG. 15C are views of various cross sections of the active regions and the gates to the third layer of FIG. 14A and FIG. 14B, and FIG. 15A is a cross-sectional view taken along a broken line Y1-Y1, FIG. 15B is a cross-sectional view taken along a broken line Y2-Y2, and FIG. 15C is a cross-sectional view taken along a broken line Y3-Y3. FIG. 16 is a view of various cross sections of the active regions and the gates to the third layer of FIG. 14A and FIG. 14B, and is a cross-sectional view taken along a broken line X1-X1. Note that the same components and the like as those in the first embodiment are denoted by the same numerals.

The CMOS circuit includes a standard cell 91 configured having a CMOS transistor and a multilayer wiring structure 2 for the standard cell 91, on a semiconductor substrate 10.

The standard cell 91 includes a P-type nanowire FET 92 being a PMOS transistor and an N-type nanowire FET 93 being an NMOS transistor. The P-type nanowire FET 92 includes a gate 12, and an active region 95 where P-type source/drain regions are formed on both sides of the gate 12 of the semiconductor substrate 10. In the active region 95, a channel 95a connected to the P-type source/drain regions is formed in a shape of a plurality of wires. The N-type nanowire FET 93 includes a gate 12, and an active region 96 where N-type source/drain regions are formed on both sides of the gate 12 of the semiconductor substrate 10. In the active region 96, a channel 96a connected to the N-type source/drain regions is formed in a shape of a plurality of wires. The active regions 95, 96 are formed by etching the surface of the semiconductor substrate 10, and demarcated by an STI element isolation structure 15. A plurality of gates 12 are arranged side by side along a second direction, namely, a Y-direction here.

On the nanowire FETs 92, 93, local interconnect layers 97 electrically connected to the active regions 95, 96 are formed respectively.

The multilayer wiring structure 2 includes a plurality of wiring layers stacked, and a first layer M1, a second layer M2, and a third layer M3 are illustrated in the illustrated example.

The first layer M1 is located above the local interconnect layers 97, includes a plurality of wirings arranged side by side along a first direction, namely, an X-direction here, and includes a first power supply line 17 being a Vdd power supply wiring and a second power supply line 18 being a Vss power supply wiring. The first layer M1 includes a first signal line 19a connected to one of the local interconnect layers 97. The first layer M1 includes a second signal line 19b connected to one of the gates 12. The first layer M1 includes a third signal line 19c connected to one of the local interconnect layers 97, which is different from the local interconnect layer 97 connected with the first signal line 19a.

The third layer M3 includes a plurality of wirings arranged side by side along the first direction as with the wirings of the first layer M1, namely, the X-direction here.

The third layer M3 includes a third power supply line 31 that is located above the first power supply line 17 and electrically connected to the first power supply line 17 to become a support wiring. The third layer M3 includes a fourth power supply line 32 that is located above the second power supply line 18 and electrically connected to the second power supply line 18 to become a support wiring.

The second layer M2 includes a plurality of wirings arranged side by side along a second direction different from the direction of the wirings of the first layer M1, namely, a Y-direction perpendicular to the X-direction here.

The second layer M2 includes, as a wiring M2A, a first connection wiring 21 that is located above the first power supply line 17 and below the third power supply line 31 and electrically connected to the first power supply line 17 and to the third power supply line 31 and extends in the Y-direction in a plan view. The second layer M2 includes a second connection wiring 22 that is located above the second power supply line 18 and below the fourth power supply line 32 and electrically connected to the second power supply line 18 and to the fourth power supply line 32 and extends in the Y-direction in a plan view. The first connection wiring 21 and the second connection wiring 22 are physically cut from each other, and arranged to line up along a longitudinal direction in a plan view. Between the first connection wiring 21 and the second connection wiring 22 in the wiring M2A, a fourth signal line 23 for the standard cell 91 extending in the Y-direction in a plan view is arranged.

The second layer M2 includes a wiring M2B adjacent to the wiring M2A. In the wiring M2B, a fifth signal line (output wiring) 24 for the standard cell 91 is arranged.

The third layer M3 includes a first input wiring 33 to the gates 12 of the standard cell 91, which is electrically connected to the fourth signal line 23 of the second layer M2 and to the second signal line 19b of the first layer M1. A signal may be transmitted to the gates 12 of the standard cell 91 via a wiring of a fourth layer on the third layer M3. Alternatively, the first input wiring 33 may be connected to an output wiring for another standard cell. Alternatively, an input wiring may be provided in the first layer M1 in place of the first input wiring 33.

In this embodiment, in the configuration in which the wirings are formed in the X-direction or in the Y-direction alternately for each layer using, for example, the double patterning method, the support wiring for the first power supply line 17 of the first layer M1 is formed as the third power supply line 31 of the third layer M3, and the support wiring for the second power supply line 18 of the first layer M1 is formed as the fourth power supply line 32 of the third layer M3. This configuration realizes a highly-reliable CMOS circuit which enables achievement of microfabrication of the multilayer wiring structure 2 and suppression of occurrence of EM.

Further, in forming the wirings of the second layer M2, for example, the wiring M2A is formed by using the mandrel pattern and the wiring M2B is formed by using the spacer pattern. In this case, the wiring M2A is cut inside the standard cell 91, so that the fourth signal line 23 of the standard cell 91 extending in the Y-direction in a plan view is arranged between the first connection wiring 21 and the second connection wiring 22. This configuration enables effective utilization of a space between wirings and therefore contributes to further microfabrication of the multilayer wiring structure 2. Note that the wiring M2A may be formed by using the spacer pattern, and the wiring M2B may be formed by using the mandrel pattern.

The present invention is applied to a system LSI including, for example, a CPU, an SRAM, a ROM and a I/O circuit. The present invention is also applicable to a system LSI including a GPU, a DSP or the like in place of the CPU. This semiconductor device is used as a processor for a high-end server or network interface device, or as a processor for a low-power-consumption video and audio device or mobile device.

More specifically, in the case where a clock inverter or a clock buffer switches at high operating rate in a high-frequency clock system of 1 GHz or higher in the CPU, the present invention can be used to strengthen the power supply lines with saved area, thereby improving IR-DROP and EM resistance.

Besides, application of the present invention to a Ring-type VCO inverter performing high-frequency operation in a peripheral circuit enables provision of a dissipation path for self-heating generated in the transistor, thereby improving EM resistance. Further, this dissipation path can also protect signal wirings and power supply wirings of the inverter from heat conduction from the outside when a heat generation source such as a current source is located therearound.

The strengthened power supply lines and dissipation path in the present invention can be automatically laid out using a placement and routing tool in implementing, for example, the logic block of the CPU. It is also possible to manually lay out a portion desired to be strengthened.

Though the example of forming the multilayer wiring structure of the present invention by the double patterning method has been explained, the multilayer wiring structure of the present invention may be formed, for example, by a single patterning method, a quadruple patterning method or the like.

According to the above aspect, a highly-reliable semiconductor device is realized which enables achievement of microfabrication of a multilayer wiring structure and suppression of occurrence of EM by providing support wirings for power supply wirings in a case where wirings are formed in different directions alternately in order from a lower layer of the multilayer wiring structure.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
   a first standard cell;
   a plurality of first wirings extending in a first direction in a plan view;
   a plurality of second wirings formed above the first wirings and extending in a second direction different from the first direction in a plan view; and
   a plurality of third wirings formed above the second wirings and extending in the first direction in a plan view, wherein:
   the plurality of first wirings include a first power supply line and a second power supply line;
   the plurality of third wirings include a third power supply line that is located above the first power supply line and electrically connected to the first power supply line,
   the plurality of third wirings include a fourth power supply line that is located above the second power supply line and electrically connected to the second power supply line;
   the plurality of second wirings include a first connection wiring that is located above the first power supply line and below the third power supply line and electrically connected to the first power supply line and to the third power supply line and extends in the second direction in a plan view;
   the plurality of second wirings include a second connection wiring that is located above the second power supply line and below the fourth power supply line and electrically connected to the second power supply line and to the fourth power supply line and extends in the second direction in a plan view,
   the first standard cell includes the first power supply line, the second power supply line, the third power supply line, the fourth power supply line, the first connection wiring and the second connection wiring,
   the third power supply line is superposed on the first power supply line in a plan view; and
   the fourth power supply line is superposed on the second power supply line in a plan view.

2. The semiconductor device according to claim 1, wherein
   the plurality of second wirings include a first signal line that is located between the first connection wiring and the second connection wiring in a plan view and extends in the second direction in a plan view, and
   the standard cell includes the first signal line.

3. The semiconductor device according to claim 2, wherein
   the plurality of third wirings include a second signal line that is electrically connected to the first signal line, and
   the first standard cell includes the second signal line.

4. The semiconductor device according to claim 3, further comprising a second standard cell arranged side by side with the first standard cell in a plan view,
wherein the second standard cell includes a first output wiring, and
the second signal line is electrically connected to the first output wiring of the second standard cell.

5. The semiconductor device according to claim 3, wherein
the plurality of first wirings include a third signal line that is electrically connected to the first signal line, and
the first standard cell includes the third signal line.

6. The semiconductor device according to claim 3, wherein
the third power supply line is wider than the second signal line, and
the fourth power supply line is wider than the second signal line.

7. The semiconductor device according to claim 2, further comprising
a first NMOS transistor that includes a first source, a first drain and a first gate, and
a first PMOS transistor that includes a second source, a second drain and a second gate,
wherein
the first NMOS transistor is located between the first power supply line and the first PMOS transistor in the second direction in a plan view,
the first PMOS transistor is located between the second power supply line and the first NMOS transistor in the second direction in a plan view,
the first source is electrically connected to the first power supply line,
the second source is electrically connected to the second power supply line, and
the first standard cell includes the first NMOS transistor and the first PMOS transistor.

8. The semiconductor device according to claim 7, wherein
the plurality of the second wirings include a fourth signal line that extends to the second direction in a plan view,
the first gate is connected to the second gate,
the first gate and the second gate are electrically connected to the first signal wiring,
the first drain and the second drain are electrically connected to the second signal wiring.

9. The semiconductor device according to claim 8, wherein
a first space is located between the first connection wiring and the first signal line in a plan view,
a second space is located between the second connection wiring and the first signal line in a plan view, and
the fourth signal line is located adjacent to the first signal wiring in the second direction in a plan view.

10. The semiconductor device according to claim 9, wherein
the first space is located adjacent to the fourth signal line in the first direction in a plan view, and
the second space is located adjacent to the fourth signal line in the first direction in a plan view.

11. The semiconductor device according to claim 8, wherein
a first part of the fourth signal line is superposed on the first power supply line in a plan view, and
a second part of the fourth signal line is superposed on the second power supply line in a plan view.

12. The semiconductor device according to claim 8, wherein
a first part of the fourth signal line is located under the third power supply line in a plan view, and
a second part of the fourth signal line is located under the fourth power supply line in a plan view.

13. The semiconductor device according to claim 8, further comprising a third standard cell that is located adjacent to the first standard cell in the second direction in a plan view,
wherein
the fourth signal line is connected to a wiring of the third standard cell.

14. The semiconductor device according to claim 7, wherein
the first NMOS transistor includes a first fin,
the first PMOS transistor includes a second fin,
the first source and the first drain are formed in the first fin, and
the second source and the second drain are formed in the second fin.

15. The semiconductor device according to claim 7, wherein
the first NMOS transistor includes a first nanowire,
the first PMOS transistor includes a second nanowire,
the first nanowire is located between the first source and the first drain,
the second nanowire is located between the second source and the second drain,
the first gate is located on the first nanowire, and
the second gate is located on the second nanowire.

16. The semiconductor device according to claim 2, further comprising
a first NMOS transistor that includes a first source, a first drain and a first gate,
a first PMOS transistor that includes a second source, a second drain and a second gate,
a second NMOS transistor that includes a third source, a third drain and a third gate,
a second PMOS transistor that includes a fourth source, a fourth drain and a fourth gate
wherein
the first NMOS transistor is located between the first power supply line and the first PMOS transistor in the second direction in a plan view,
the first PMOS transistor is located between the second power supply line and the first NMOS transistor in the second direction in a plan view,
the second NMOS transistor is located between the first power supply line and the second PMOS transistor in the second direction in a plan view,
the second PMOS transistor is located between the second power supply line and the second NMOS transistor in the second direction in a plan view,
the first source is electrically connected to the first power supply line,
the second source is electrically connected to the second power supply line,
the fourth source is electrically connected to the second power supply line,
the third source is electrically connected to the first drain,
the third drain is electrically connected to the second drain and the fourth drain,
the first gate is electrically connected to the second gate, the third gate is electrically connected to the fourth gate, the first signal line is electrically connected to the first gate and the second gate, and the first standard cell includes the first NMOS transistor, the first PMOS transistor, the second NMOS transistor and the second PMOS transistor.

17. The semiconductor device according to claim 16, wherein the plurality of second wirings include a third connection wiring that is located above the first power supply line and below the third power supply line and electrically connected to the first power supply line and to the third power supply line and extends in the second direction in a plan view;

the plurality of second wirings include a fourth connection wiring that is located above the second power supply line and below the fourth power supply line and electrically connected to the second power supply line and to the fourth power supply line and extends in the second direction in a plan view, the plurality of second wirings include a second signal line that is located between the third connection wiring and the fourth connection wiring in a plan view and extends in the second direction in a plan view, the first connection wiring and the third connection wiring are arranged in the first direction in a plan view, the second connection wiring and the fourth connection wiring are arranged in the first direction in a plan view, the second signal line is electrically connected to the third gate and the fourth gate, and the first standard cell includes the third connection wiring, the fourth connection wiring and the second signal line.

18. The semiconductor device according to claim 1, wherein the third power supply line is wider than the first power supply line, and the fourth power supply line is wider than the second power supply line.

19. The semiconductor device according to claim 1, wherein the plurality of first wirings is formed by damascene method, the plurality of second wirings is formed by damascene method, and the plurality of third wirings is formed by damascene method.

20. The semiconductor device according to claim 1, wherein the first power supply line includes Cu, the first power supply line includes a first barrier layer that includes Ta, the second power supply line includes Cu, the second power supply line includes a second barrier layer that includes Ta, the third power supply line includes Cu, the third power supply line includes a third barrier layer that includes Ta, the fourth power supply line includes Cu, the fourth power supply line includes a fourth barrier layer that includes Ta, the first connection wiring includes Cu, the first connection wiring includes a fifth barrier layer that includes Ta, the second connection wiring includes Cu, and the second connection wiring includes a sixth barrier layer that includes Ta.

* * * * *